(12) United States Patent
Miya et al.

(10) Patent No.: US 7,584,760 B2
(45) Date of Patent: Sep. 8, 2009

(54) SUBSTRATE PROCESSING APPARATUS

(75) Inventors: Katsuhiko Miya, Kyoto (JP); Akira Izumi, Kyoto (JP); Takashi Kawamura, Kyoto (JP); Itsuki Kajino, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 421 days.

(21) Appl. No.: 10/659,213

(22) Filed: Sep. 10, 2003

(65) Prior Publication Data
US 2004/0050491 A1   Mar. 18, 2004

(30) Foreign Application Priority Data

| Sep. 13, 2002 | (JP) | 2002-269075 |
| Oct. 31, 2002 | (JP) | 2002-317607 |
| Nov. 22, 2002 | (JP) | 2002-339763 |
| Jan. 20, 2003 | (JP) | 2003-011111 |

(51) Int. Cl.
*B08B 3/00* (2006.01)
(52) U.S. Cl. ........... 134/94.1; 134/95.3; 134/137; 134/902
(58) Field of Classification Search ........... 134/99, 134/157, 155, 902, 153, 61, 64, 95.2, 95.3, 134/94.3, 94.1, 137; 118/52, 54; 156/345
See application file for complete search history.

(56) References Cited

U.S. PATENT DOCUMENTS

| 4,903,717 A * | 2/1990 | Sumnitsch ............ 134/99.1 |
| 5,288,333 A * | 2/1994 | Tanaka et al. ........... 134/31 |
| 5,927,303 A * | 7/1999 | Miya et al. ............. 134/148 |
| 6,273,104 B1 * | 8/2001 | Shinbara et al. ......... 134/25.4 |
| 6,332,723 B1 * | 12/2001 | Matsuyama et al. ....... 396/571 |
| 6,672,318 B1 * | 1/2004 | Tsuchiya et al. ......... 134/147 |
| 6,807,974 B2 * | 10/2004 | Ono et al. .............. 134/153 |

(Continued)

FOREIGN PATENT DOCUMENTS

JP      63-111960      7/1988

(Continued)

OTHER PUBLICATIONS

Japanese Office Action dated Sep. 9, 2008.

*Primary Examiner*—Michael Barr
*Assistant Examiner*—Jason Heckert
(74) *Attorney, Agent, or Firm*—Ostrolenk, Faber, Gerb & Soffen, LLP

(57) ABSTRACT

A substrate (W) is held and rotated in its horizontal position on a spin base (10). A processing liquid can be supplied from a processing liquid lower nozzle 15 to the lower surface of the substrate (W). The upper surface of the substrate (W) is covered with an atmosphere blocking plate (30). A splash guard (50) is disposed so as to circumscribe the substrate (W). A guard (52) is curved such that the vertical cross section of a recovery port (52f) of the splash guard (50) is of substantially U-shape opening to the center of the splash guard (50), so that the maximum internal diameter part of the recovery port (52f) is brought near a guard (53). The space between the internal wall surface of the recovery port (52f) and the substrate (W) is increased to thereby suppress the bounce of the processing liquid flying spattering from the substrate (W) in rotation.

4 Claims, 19 Drawing Sheets

U.S. PATENT DOCUMENTS

| | | | |
|---|---|---|---|
| 6,983,755 B2 * | 1/2006 | Nam et al. | 134/147 |
| 7,074,726 B2 * | 7/2006 | Sugimoto et al. | 438/745 |
| 2002/0043275 A1 * | 4/2002 | Okuda et al. | 134/30 |

FOREIGN PATENT DOCUMENTS

| | | | |
|---|---|---|---|
| JP | 05-243202 | | 9/1993 |
| JP | H05-259060 | | 10/1993 |
| JP | 7-15150 | | 2/1995 |
| JP | 10-137664 | | 5/1998 |
| JP | 11-87294 | * | 3/1999 |
| JP | 11-168078 | | 6/1999 |
| JP | 2000-183010 | * | 6/2000 |
| JP | 2000-185264 | | 7/2000 |
| JP | 2000-343046 | | 12/2000 |
| JP | 2002-59067 | | 2/2002 |
| JP | 2002-059087 | | 2/2002 |
| JP | 2002-282764 | | 10/2002 |
| JP | 2002-282784 | | 10/2002 |
| JP | 2002-319561 | | 10/2002 |
| JP | 2002-329705 | | 11/2002 |
| JP | 2004-111487 | | 4/2004 |

* cited by examiner

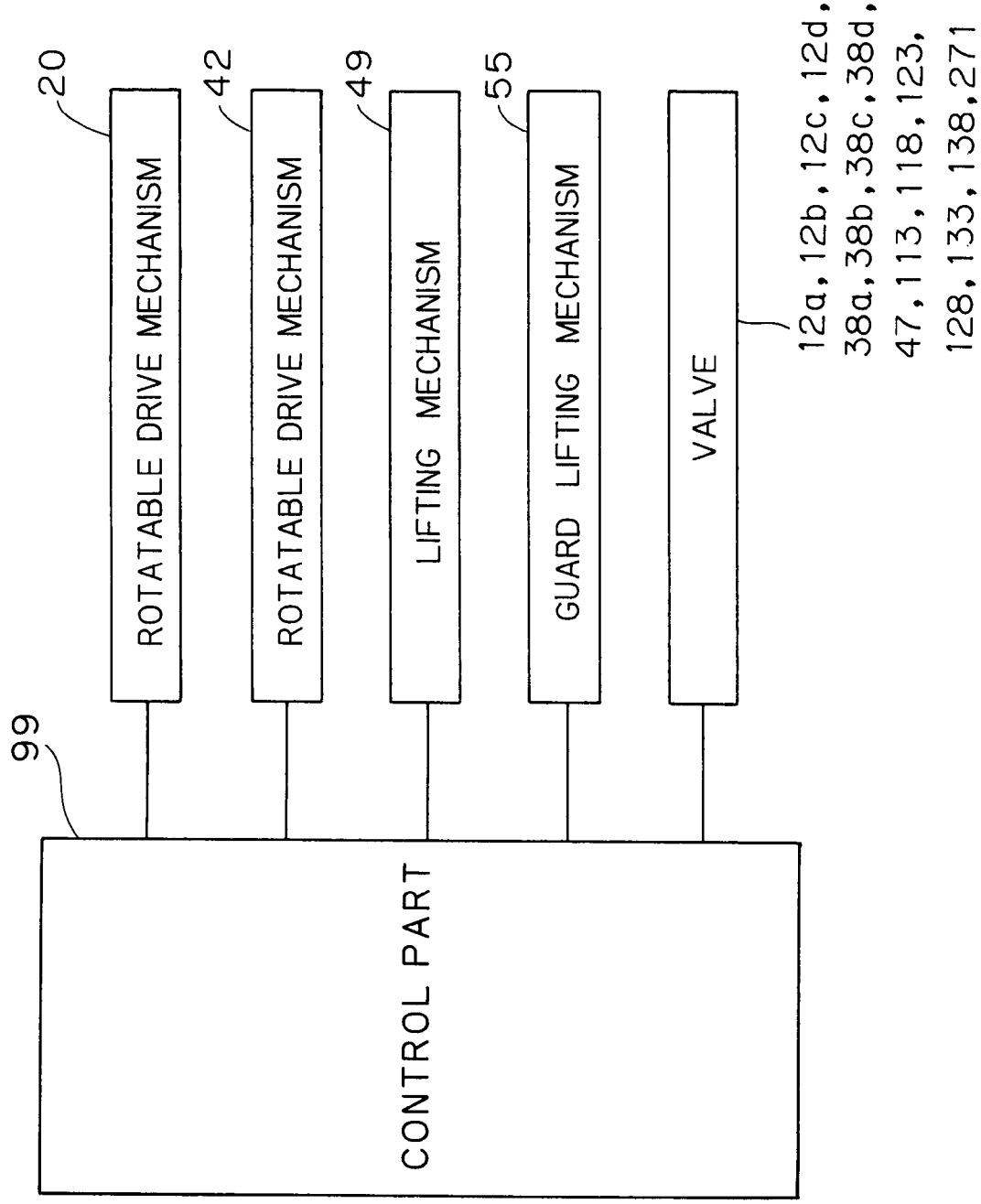

SUBSTRATE PROCESSING APPARATUS

BACKGROUND OF THE INVENTION

1. Field of the Invention

The present invention relates to a substrate processing apparatus that performs a predetermined substrate process such as cleaning process by supplying a processing liquid to a semiconductor substrate, glass substrate for liquid crystal display, glass substrate for photomask, substrate for optical disk or the like (hereinafter referred to simply as a "substrate"), while rotating the substrate.

2. Description of the Background Art

There has conventionally been used a substrate processing apparatus of single-wafer type that performs etching and cleaning processes by supping a chemical solution or rinsing pure water (chemical solution and pure water are generally called "processing liquid" in the present specification) to the surface and/or reverse of a substrate mounted on a spin base, while rotating the substrate. The substrate processing apparatus of this type is usually provided with a cup unit for receiving and recovering a processing liquid flying spattering from the substrate in rotation.

As a cup unit to recover processing liquid, there has been used one in which a plurality of cups are so arranged in multistage as to separately recover various types of processing liquids and then separate depending on the purpose of recovery. For example, the individual processing liquids are separately and properly recovered by changing the type of cup disposed about the periphery of the substrate, depending on the type of processing liquid.

However, since a plurality of different cylindrical cups are coaxially arranged in the conventional cup unit, a cup disposed closer to the axis has a smaller internal diameter. Particularly, the upper end part of each cup is inwardly inclined (toward the substrate held by the spin base), so that the upper internal diameter of the innermost cup is further reduced.

This causes the problem that the peripheral part of the substrate held by the spin base is considerably close to the upper part of the innermost cup and the processing liquid flying spattering from the substrate in rotation strikes the cups and it becomes fine droplets to be attached on the substrate surface. There is also the possibility that the processing liquid so adhered to the substrate is then dried to form particles contaminating the substrate.

SUMMARY OF THE INVENTION

The present invention is directed to a substrate processing apparatus.

According to the present invention, a substrate processing apparatus includes: (a) a substrate holding part to hold a substrate in its substantially horizontal position; (b) a rotary part to rotate the substrate held by the substrate holding part in a substantially horizontal plane; (c) a processing liquid supply part to selectively supply a plurality of types of processing liquids to the substrate held by the substrate holding part; (d) a plurality of guide parts of substantially annulus ring shape that traps a processing liquid flying spattering from a substrate in rotation on the side of the substrate held by the substrate holding part; (e) a plurality of processing liquid passages of substantially cylindrical shape that are provided in one-to-one correspondence with the plurality of guide parts and feed downwardly processing liquids introduced from their corresponding guide parts; and (f) a position adjusting part to adjust the physical relationship between the substrate held by the substrate holding part and the guide parts, such that a processing liquid flying spattering from a substrate in rotation is trapped by the guide part corresponding to the recovery type of the processing liquid. The plurality of guide parts includes: (d-1) a first processing liquid guide part to trap a first processing liquid flying spattering from a substrate in rotation; and (d-2) a plurality of second processing liquid guide parts that are stacked in multistage on the first processing liquid guide part and trap a second processing liquid flying spattering from a substrate in rotation, whereby a maximum internal diameter of at least the lowermost second processing liquid guide part in the plurality of second processing liquid guide parts is greater than an internal diameter of a processing liquid passage corresponding to the lowermost second processing liquid guide part.

The space between the inside of the lowermost second processing liquid guide part and the substrate held by the substrate holding part can be increased to thereby suppress the bounce of the processing liquid flying spattering from the substrate in rotation.

Preferably, disposed are a plurality of first recovery tanks corresponding to the second processing liquid guide parts so as to recover, through the corresponding processing liquid passages, a second processing liquid flying spattering from the substrate by rotation. In addition, there is a plurality of storage parts that are arranged separately below the plurality of first recovery tanks so as to correspond to the plurality of first recovery tanks, respectively. Each storage part includes a storage tank having an inside space shape that is approximately the same as the internal space shape of the corresponding first recovery tank; and a plurality of pipes to connect in communication at a plurality of locations between the bottom of the corresponding first recovery tank and the inside of the storage tank.

The time that the processing liquid is present in the recovery tank in the vicinity of the substrate can be reduced thereby to satisfactorily execute substrate processing.

Preferably, there is also a first processing liquid discharge part that has a discharge port disposed in the first processing liquid guide part and discharges the first processing liquid from the discharge port to the substrate holding part.

It is avoidable that particles caused by the dried second processing liquid remaining in the substrate holding part contaminate the substrate thereby to induce poor processing. It is also possible to suppress that the cleaning liquid containing the second processing liquid attaches to, for example, the internal wall of the chamber housing the substrate holding part. This permits to reduce particles, namely, contamination accumulated, which is caused by the second processing liquid to be dried on the surface of structures such as the internal wall of the chamber.

The present invention is also directed to an apparatus that performs a predetermined substrate processing by supplying a processing liquid to a substrate while rotating the substrate.

According to the present invention, a substrate processing apparatus includes: (a) a substrate holding part to hold a substrate in its substantially horizontal position; (b) a rotary part to rotate the substrate held by the substrate holding part in a substantially horizontal plane; (c) a processing liquid supply part to selectively supply a plurality of types of processing liquids to the substrate held by the substrate holding part; (d) a four-stage splash guard that is disposed so as to annularly circumscribe the substrate held by the substrate holding part and is composed of a first guard, second guard, third guard and fourth guard arranged in inner-to-outer order; and (e) a lifting and lowering part to lift and lower the splash guard substantially vertically. In a vertical direction, an inside of the first guard, a space between the first and second guards, a space between the second and third guard, and a space between the third and fourth guards serve as a first guide part, second guide part, third guide part and fourth guide part, respectively. In a horizontal direction, the inside of the first guard, the space between the first and second guards, the space between the second and third guard, and the space between the third and fourth guards serve as a first processing liquid passage, second processing liquid passage, third processing liquid passage and fourth processing liquid passage, respectively. The second guard is curved such that the maximum internal diameter of the second guide part is greater than the internal diameter of the second processing liquid passage. The first guard receives a first processing liquid flying spattering from a substrate in rotation. The second, third and fourth guards receive a second processing liquid flying spattering from a substrate in rotation.

The space between the inside of the second processing liquid guide part and the substrate held by the substrate holding part can be increased to thereby suppress the bounce of the processing liquid flying spattering from the substrate in rotation.

Accordingly, it is an object of the present invention to provide a substrate processing apparatus that can suppress splashing of a processing liquid flying spattering from a substrate in rotation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a block diagram showing the configuration of a control system of the substrate processing apparatus of the present invention;

DESCRIPTION OF THE PREFERRED EMBODIMENTS

Preferred embodiments of the present invention will be described in detail by referring to the accompanying drawings.

Figure 1:
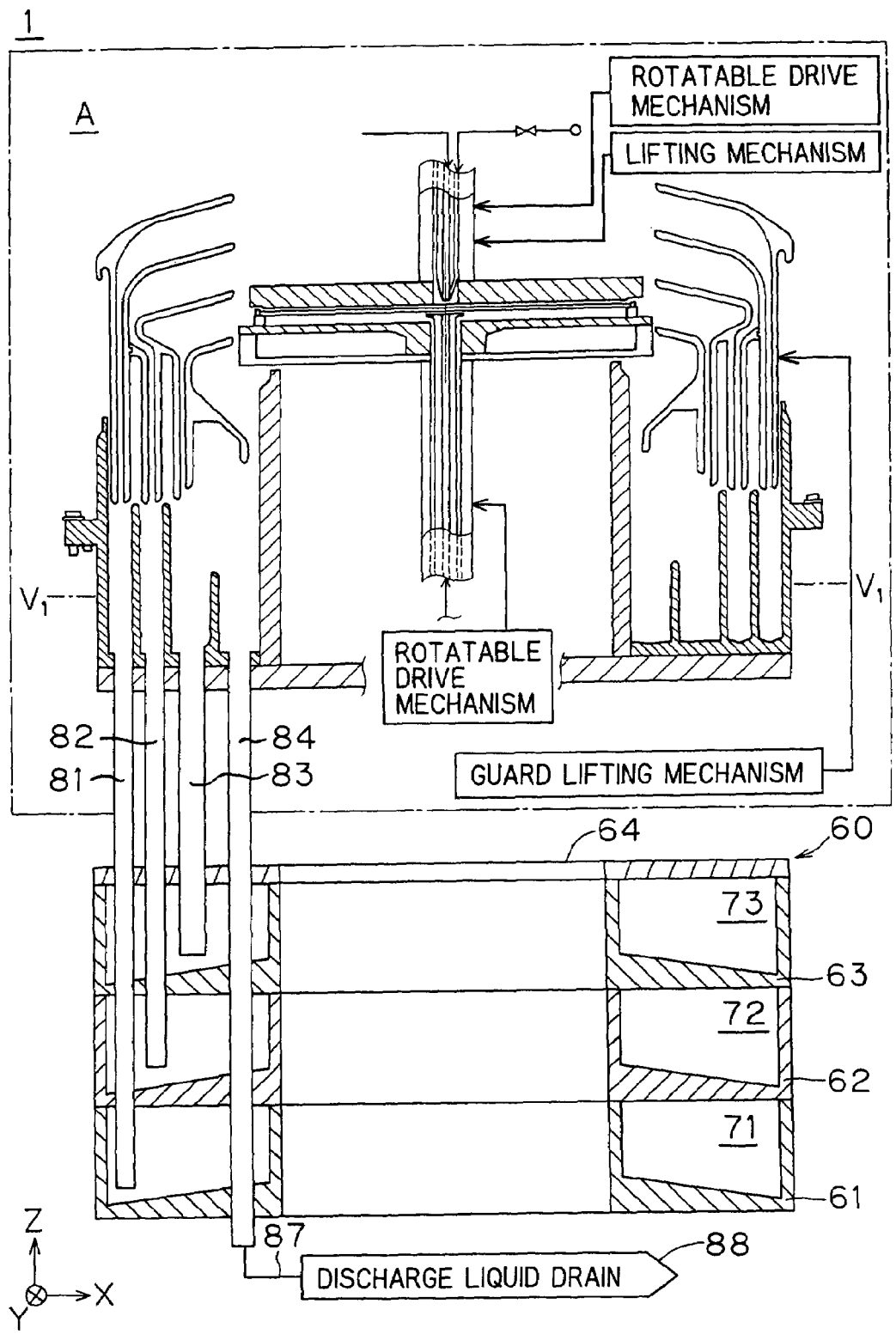
FIG. 1 is a longitudinal sectional view showing one example of the configuration of a substrate processing apparatus according to a first preferred embodiment of the present invention.
Figure 2:
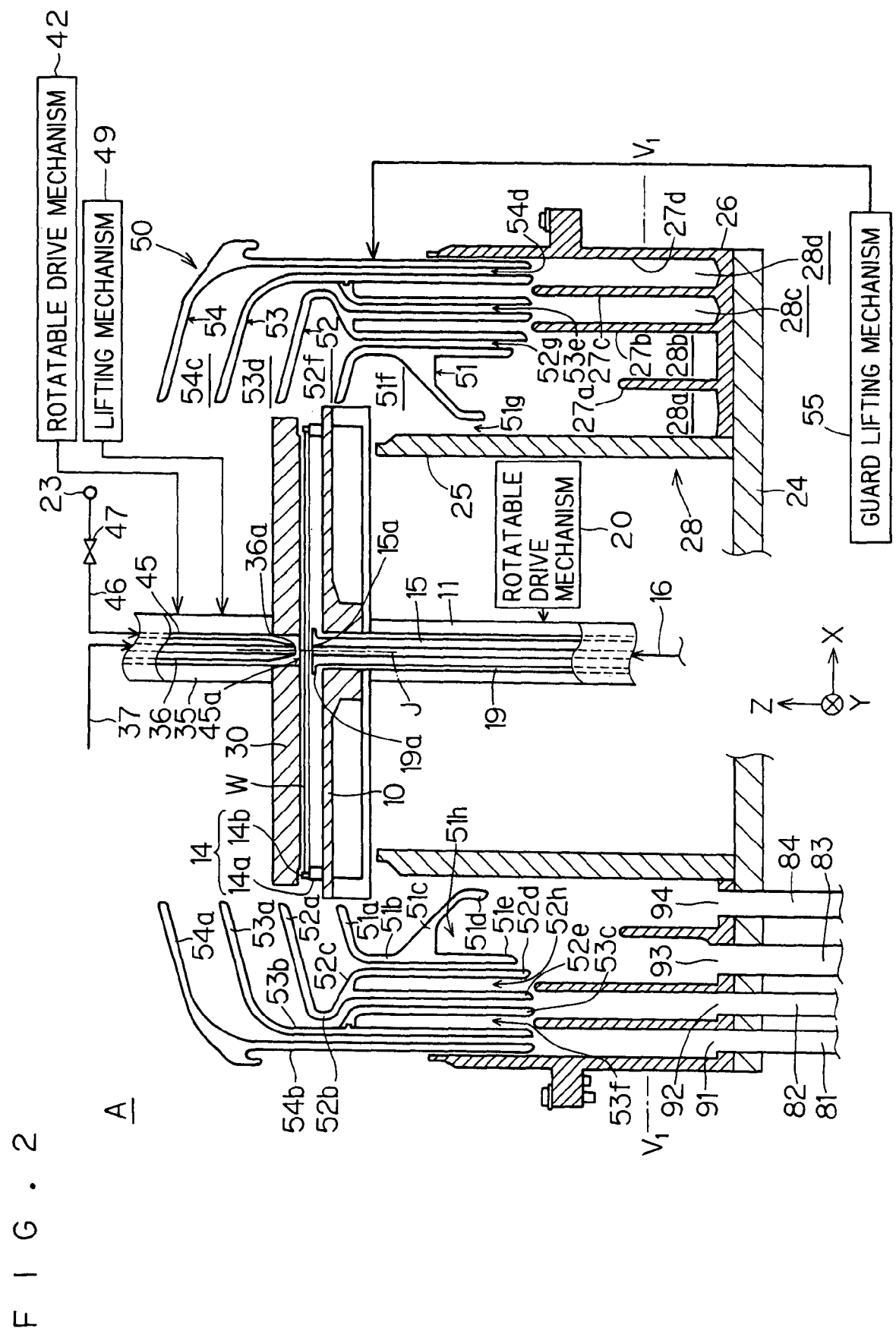
FIG. 2 is a diagram showing in enlarged dimension section 'A' of FIG. 1.
Figure 3:
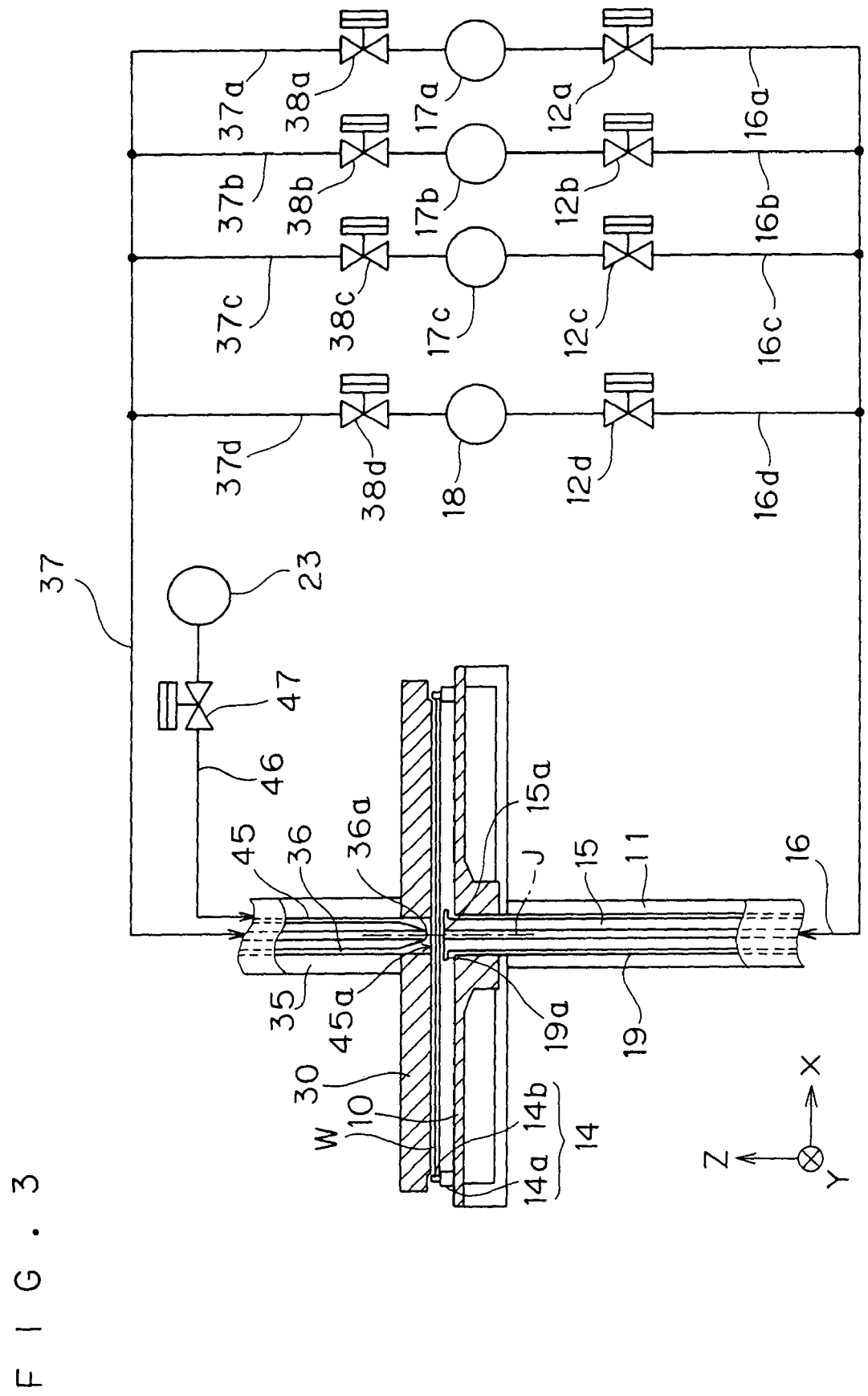
FIG. 3 is a diagram showing one example of a supply part that supplies a processing liquid and inert gas to a substrate.
Figure 4:
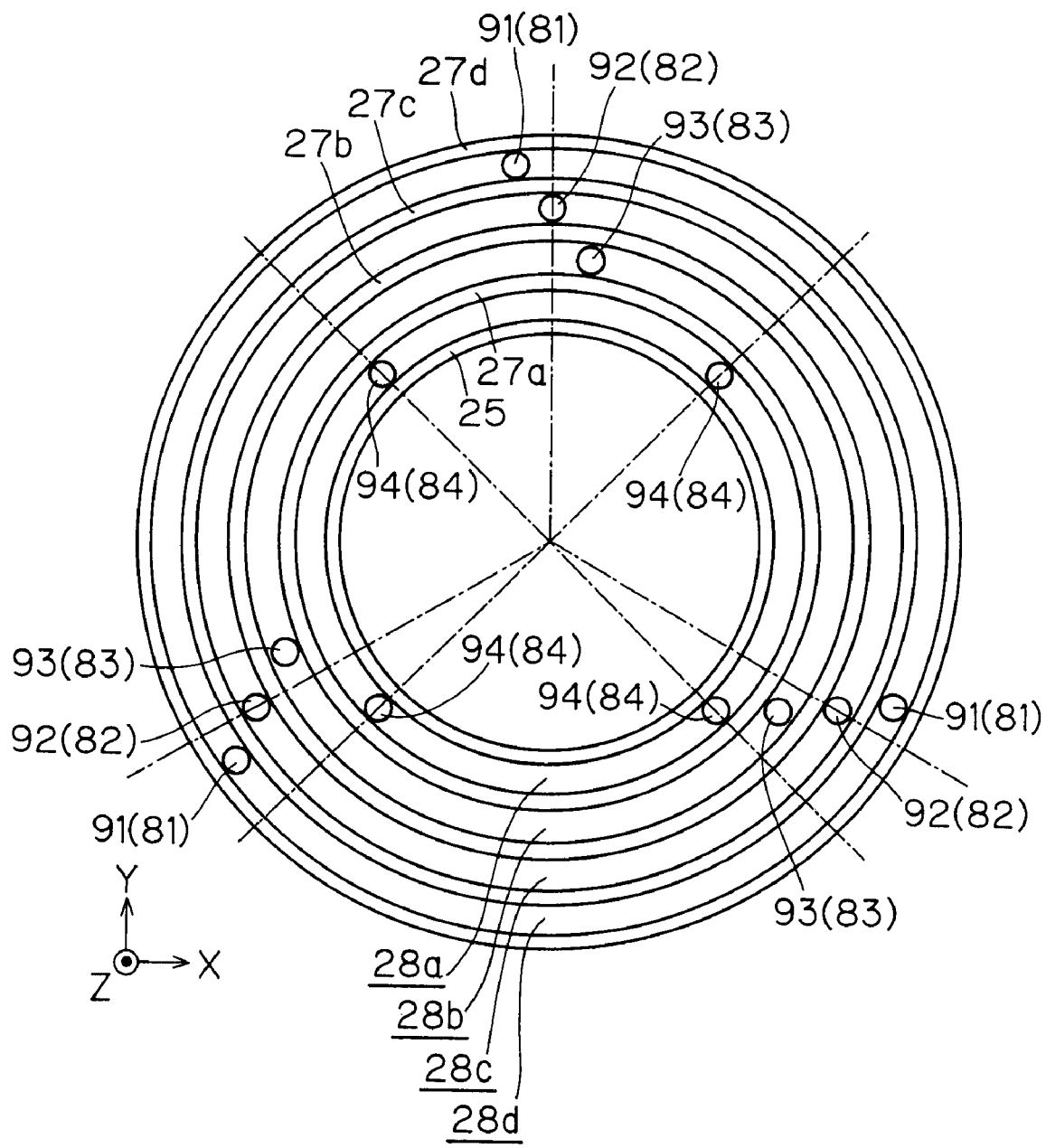
FIG. 4 is a diagram showing a cross section of a recovery tank as seen from line VI-VI of FIG. 1.

1. First Preferred Embodiment 1-1. Configuration of Substrate Processing Apparatus FIG. 1 is a longitudinal sectional view of the configuration of a substrate processing apparatus 1 of the present invention. FIG. 2 is a diagram showing in enlarged dimension section 'A' (the range surrounded by dash-single-dot line) of the substrate processing apparatus 1 of FIG. 1. FIG. 3 is a diagram showing one example of a supply part that supplies a processing liquid and inert gas to a substrate. FIG. 4 is a diagram showing a cross section in the vicinity of a discharged liquid tank (recovery tank), which will be described hereinafter.

The substrate processing apparatus 1 of the first preferred embodiment is capable of performing processes such as bevel etching by supplying a chemical solution to a lower surface of a substrate W that is a semiconductor wafer. In FIG. 1 and subsequent drawings, there is appended, as needed, an X-Y-Z rectangular coordinate system taking a Z-axis direction as a vertical direction and an X-Y plane as a horizontal plane.

The substrate processing apparatus 1 comprises mainly a spin base 10 to hold a substrate W, a plurality of chuck pins 14 disposed on the spin base 10, a rotatable drive mechanism 20 to rotate the spin base 10, an atmosphere blocking plate 30 disposed so as to oppose to the spin base 10, a splash guard 50 circumscribing the periphery of the substrate W held by the spin base 10, a mechanism that supplies a processing liquid and inert gas to the substrate W held on the spin base 10, and a mechanism to lift and lower the atmosphere blocking plate 30 and splash guard 50.

The substrate W is held in its substantially horizontal position on the spin base 10. The spin base 10 is a disk-like member that has at its center an opening and on its upper surface the plurality of chuck pins 14 to grip the peripheral part of the circular substrate W. The number of the chuck pins 14 may be three or more in order to securely hold the circular substrate W. In the first preferred embodiment, six chuck pins 14 are spaced uniformly (60° intervals) about the periphery of the spin base 10. Note that two chuck pins 14 are shown for convenience in illustrating FIG. 2.

Each of the six chuck pins 14 has a substrate support part 14a to support the peripheral part of the substrate W from below and a substrate holding part 14b to hold the substrate W by pressing the outer peripheral end face of the substrate W supported by the substrate support part 14a. Each chuck pin 14 is so configured as to be changeable between a pressing state that the substrate holding part 14b presses the outer peripheral end face of the substrate W, and a release state that the substrate holding part 14b is apart from the outer peripheral end face of the substrate W. The six chuck pins 14 can be changed between the pressing state and release state by any of various known mechanisms.

The six chuck pins 14 are brought into their release states when giving the substrate W to the spin base 10 and when receiving the substrate W from the spin base 10. On the other hand, the six chuck pins 14 are brought into their pressing states when performing various processes to the substrate W, which are described hereinafter. By bringing the six chuck pins 14 into their pressing states, they can grip and hold the peripheral part of the substrate W in its horizontal position spaced a predetermined distance from the spin base 10. The substrate W is held with its upper surface facing up and its lower surface facing down. When the six chuck pins 14 are brought into their pressing states to hold a substrate W, the upper end part of the substrate holding part 14b projects beyond the upper surface of the substrate W. This is to securely hold the substrate W in order to prevent it from dropping out of the chuck pins 14 during process.

A rotary axis 11 is vertically disposed at the center of a lower surface side of the spin base 10. The rotary axis 11 is a hollow cylindrical member, and a processing liquid lower nozzle 15 is inserted in a hollow part on the inside of the rotary axis 11. A rotatable drive mechanism 20 is operatively connected to the vicinity of a lower end of the rotary axis 11. The rotatable drive mechanism 20 is composed of an electric motor and a torque transmitting mechanism to transmit the rotation of the electric motor to the rotary axis 11, so that the substrate W held by the rotary axis 11, spin base 10 and the chuck pins 14 is rotated around axis J along a vertical direction in a horizontal plane. A hollow motor, the motor axis of which is directly connected to the rotary axis 11, may be employed as a rotatable drive mechanism 20.

The processing liquid lower nozzle 15 passes through the rotary axis 11 and its top portion 15a is located immediately below the center of the substrate W held by the chuck pins 14. The bottom portion of the processing liquid lower nozzle 15 is connected in communication to a processing liquid pipe 16. As shown in FIG. 3, the bottom portion of the processing liquid pipe 16 is divided into four branch pipes 16a, 16b, 16c and 16d. A first chemical solution supply source 17a is connected in communication to the branch pipe 16a, a second chemical solution supply source 17b is connected in communication to the branch pipe 16b, a third chemical solution supply source 17c is connected in communication to the branch pipe 16c, and a pure water supply source 18 containing pure water used as a rinsing liquid is connected in communication to the branch pipe 16d. Valves 12a, 12b, 12c and 12d are provided on the branch pipes 16a, 16b, 16c and 16d, respectively. The opening and closing of the valves 12a, 12b, 12c and 12d are changed so that the first to third chemical solutions or the rinsing liquid are selectively changed to discharge or supply them from the top portion 15a of the nozzle 15 to the vicinity of the center of the lower surface of the substrate W held by the chuck pins 14.

Specifically, the first chemical solution can be supplied from the processing liquid lower nozzle 15 by opening the valve 12a and closing other valves. The second chemical solution can be supplied from the nozzle 15 by opening the valve 12b and closing other valves. The third chemical solution can be supplied from the nozzle 15 by opening the valve 12c and closing other valves. The rinsing liquid can be supplied from the nozzle 15 by opening the valve 12d and closing other valves. The first to third chemical solutions may be of different types and there can be used, for example, hydrofluoric acid (HF), buffer hydrofluoric acid (BHF), SC1 (a mixed liquid of ammonia water, hydrogen peroxide water and water) and SC2 (a mixed liquid of hydrochloric acid, hydrogen peroxide water and water).

A gap between the internal wall of the hollow part of the rotary axis 11 and the external wall of the processing liquid lower nozzle 15 serves as an air supply path 19. A top portion 19a of the air supply path 19 is directed to the lower surface of the substrate W held by the chuck pins 14. A bottom portion of the air supply path 19 is connected to a gas supply mechanism (not shown). By the gas supply mechanism, an inert gas such as nitrogen gas is supplied from the top portion 19a of the path 19 to the lower surface of the substrate W held by the chuck pins 14. As a gas supply mechanism, an inert gas supply source 23 to be described later may be directly used.

The foregoing rotary axis 11, rotatable drive mechanism 20 and the like are housed in a cylindrical casing 25 disposed on the base member 24.

Referring to FIG. 2, a receiving member 26 is fixedly attached to the periphery of the casing 25 on the base member 24. Referring to FIGS. 2 and 4, cylindrical partition members 27a, 27b, 27c and 27d are vertically disposed as the receiving member 26.

A first discharged liquid tank 28a has a ring-like internal bottom and is used as a recovery tank, by which the rinsing liquid received by a guide part 51f is temporarily stored in a doughnut-type space surrounded by this internal bottom, the external wall of the cylindrical casing 25 and the internal wall of the cylindrical partition member 27a.

Likewise, a second discharged liquid tank 28b has a ring-like internal bottom and is used as a recovery tank, by which the used chemical solution received by a recovery port 52f is temporarily stored in a doughnut-type space surrounded by this internal bottom, the external wall of the cylindrical partition member 27a and the internal wall of the cylindrical partition member 27b.

Likewise, a third discharged liquid tank 28c has a ring-like internal bottom and is used as a recovery tank, by which the used chemical solution received by a recovery port 53d is temporarily stored in a doughnut-type space surrounded by this internal bottom, the external wall of the cylindrical partition member 27b and the internal wall of the cylindrical partition member 27c. Like the discharged liquid tanks 28a to 28c, a fourth discharged liquid tank 28d has a ring-like internal bottom and is used as a recovery tank, by which the used chemical solution received by a recovery port 54c is temporarily stored in a doughnut-type space surrounded by this internal bottom, the external wall of the cylindrical partition member 27c and the internal wall of the cylindrical partition member 27d.

Recovery parts to recover the processing liquid are respectively configured by the following combinations of: the guide part 51f, passage 51g and first discharged liquid tank 28a; the recovery port (guide part) 52f, passage 52g and second discharged liquid tank 28b; the recovery port (guide part) 53d, passage 53e and third discharged liquid tank 28c; and the recovery port (guide part) 54c, passage 54d and fourth discharged liquid tank 28d.

In the bottom of the first discharged liquid tank 28a, as shown in FIG. 2, a rinsing liquid outlet 94 connected in communication to the upper end of a rinsing liquid discharge pipe 84 are disposed at a plurality of locations (four in the first preferred embodiment, as shown in FIG. 4). The rinsing liquid discharge pipe 84 is disposed so as to pass through a plate-like member 64 of a recovery unit 60, the bottom of a third ring 63, the bottom of a second ring 62 and the bottom of a first ring 61, which will be described later. The other end of the pipe 84 is connected in communication, via a pipe 87, to a discharged liquid drain 88 located outside the substrate processing apparatus 1. Therefore, the rinsing liquid temporarily stored in the first discharged liquid tank 28*a* runs down quickly from the four rinsing liquid outlets 94 to the rinsing liquid discharge pipe 84, and then discharged via the pipe 87 to the discharged liquid drain 88. That is, the rinsing liquid received and recovered by the guide part 51*f* is quickly discharged from the first discharged liquid tank 28*a* disposed near the spin base 10 that holds a substrate W, to the exterior of the substrate processing apparatus 1.

In the first preferred embodiment, the four rinsing liquid outlets 94 are uniformly spaced (90° intervals) along the bottom of the doughnut-type first discharged liquid tank 28*a*, as shown in FIG. 4. The number of the rinsing liquid outlets 94 is however not limited thereto if it is possible to quickly discharge the rinsing liquid from the first discharged liquid tank 28*a*.

In the bottom of the fourth discharged liquid tank 28*d*, as shown in FIG. 2, a first outlet 91 connected in communication to the upper end of a first chemical solution recovery pipe 81 is disposed at a plurality of locations (three in the first preferred embodiment, as shown in FIG. 4). The first chemical solution recovery pipe 81 is disposed so as to pass through a plate-like member 64 of a storage unit 60, the bottom of the third ring 63 and the bottom of the second ring 62, which will be described later. The other end of the pipe 81 is connected in communication to an internal space (hereinafter also referred to as a "first internal space") 71 of the first ring 61 spaced apart from the spin base 10 (see FIG. 1).

Therefore, the chemical solution temporarily stored in the fourth discharged liquid tank 28*d* runs down quickly from the three first outlets 91 to the first chemical solution recovery pipe 81, and then stored in the first ring 61. That is, the chemical solution received and recovered by the recovery port 54*c* is quickly discharged from the fourth discharged liquid tank 28*d* disposed near the spin base 10, and then stored in the first ring 61 spaced apart from the spin base 10.

In the first preferred embodiment, the three first outlets 91 are uniformly spaced (120° intervals) along the bottom of the doughnut-type fourth discharged liquid tank 28*d*, as shown in FIG. 4. The number of the first outlets 91 is however not limited thereto if it is possible to quickly discharge the chemical solution from the fourth discharged liquid tank 28*d*.

Likewise, in the bottom of the third discharged liquid tank 28*c*, as shown in FIG. 2, a second outlet 92 connected in communication to the upper end of a second chemical solution recovery pipe 82 is disposed at a plurality of locations (three in the first preferred embodiment, as shown in FIG. 4). The second chemical solution recovery pipe 82 is disposed so as to pass through the plate-like member 64 of the storage unit 60 and the bottom of the third ring 63, which will be described later. The other end of the pipe 82 is connected in communication to an internal space (hereinafter also referred to as a "second internal space") 72 of the second ring 62 spaced apart from the spin base 10 (see FIG. 1).

Therefore, the chemical solution temporarily stored in the third discharged liquid tank 28*c* runs down quickly from the three second outlets 92 to the second chemical solution recovery pipe 82, and then stored in the second ring 62. That is, the chemical solution received and recovered by the recovery port 53*d* is quickly discharged from the third discharged liquid tank 28*c* disposed near the spin base 10, and then stored in the second ring 62 spaced apart from the spin base 10.

In the first preferred embodiment, like the first outlets 91, the three second outlets 92 are uniformly spaced (120° intervals) along the bottom of the doughnut-type third discharged liquid tank 28*c*. The number of the second outlets 92 is however not limited thereto if it is possible to quickly discharge the chemical solution from the third discharged liquid tank 28*c*.

Likewise, in the bottom of the second discharged liquid tank 28*b*, as shown in FIG. 2, a third outlet 93 connected in communication to the upper end of a third chemical solution recovery pipe 83 is disposed at a plurality of locations (three in the first preferred embodiment, as shown in FIG. 4). The third chemical solution recovery pipe 83 is disposed so as to pass through the plate-like member 64 of the storage unit 60 to be described later. The other end of the pipe 83 is connected in communication to an internal space (hereinafter also referred to as a "third internal space") 73 of the third ring 63 spaced apart from the spin base 10 (see FIG. 1).

Therefore, the chemical solution temporarily stored in the second discharged liquid tank 28*b* runs down quickly from the three third outlets 93 to the third chemical solution recovery pipe 83, and then stored in the third ring 63. That is, the chemical solution received and recovered by the recovery port 52*f* is quickly discharged from the second discharged liquid tank 28*b* disposed near the spin base 10, and then stored in the third ring 63 spaced apart from the spin base 10.

In the first preferred embodiment, like the first outlets 91 and second outlets 92, the three third outlets 93 are uniformly spaced (120° intervals) along the bottom of the doughnut-type second discharged liquid tank 28*b*. The number of the third outlets 93 is however not limited thereto if it is possible to quickly discharge the chemical solution from the second discharged liquid tank 28*b*.

Meanwhile, in the conventional substrate processing apparatus, the chemical solution that is recovered by the guide part 51*f* and stored in the first discharged liquid tank 28*a* cannot be quickly discharged to the exterior of the substrate processing apparatus, so that the chemical solution stays in the vicinity of a substrate. By the rotation of the spin base 10, the chemical solution flows back from the first discharged liquid tank 28*a*, via the passage 51 and guide part 51*f*, to the substrate W held by the spin base 10. The chemical solution so flowed back causes poor substrate processing. For the same reason, the chemical solutions recovered by the second, third and fourth discharged liquid tanks 28*b*, 28*c* and 28*d* also cause poor substrate processing.

Whereas in the first preferred embodiment, as described above, the chemical solutions recovered by the first, second, third and fourth discharged liquid tanks 28*a*, 28*b*, 28*c* and 28*d* are discharged through the plurality of outlets disposed separately at the locations (the first, second and third internal spaces 71, 72 and 73, and the discharged liquid drain 88), which are partitioned by the base member 24 and apart from the vicinity of the spin base 10, in which a substrate processing is executed by their corresponding rinsing liquid discharge pipe 84 and the third, second and first chemical solution recovery pipes 83, 82 and 81. This enables to reduce the time that the chemical solution stay in the first to fourth discharged liquid tanks 28*a* to 28*d* disposed in the vicinity of the substrate W, thereby performing successful substrate processing.

The following is the storage unit 60. Referring to FIG. 1, the storage unit 60 comprises mainly the first ring 61, second ring 62 and third ring 63 that are vertically stacked one upon another, and serve as a plurality of storage tanks. The first ring 61, second ring 62 and third ring 63 are stacked in this order named. The stacking arrangement of the rings 61 to 63 reduces the space for the storage unit 60, thereby reducing the floor space of the substrate processing apparatus 1.

Figure 5A:
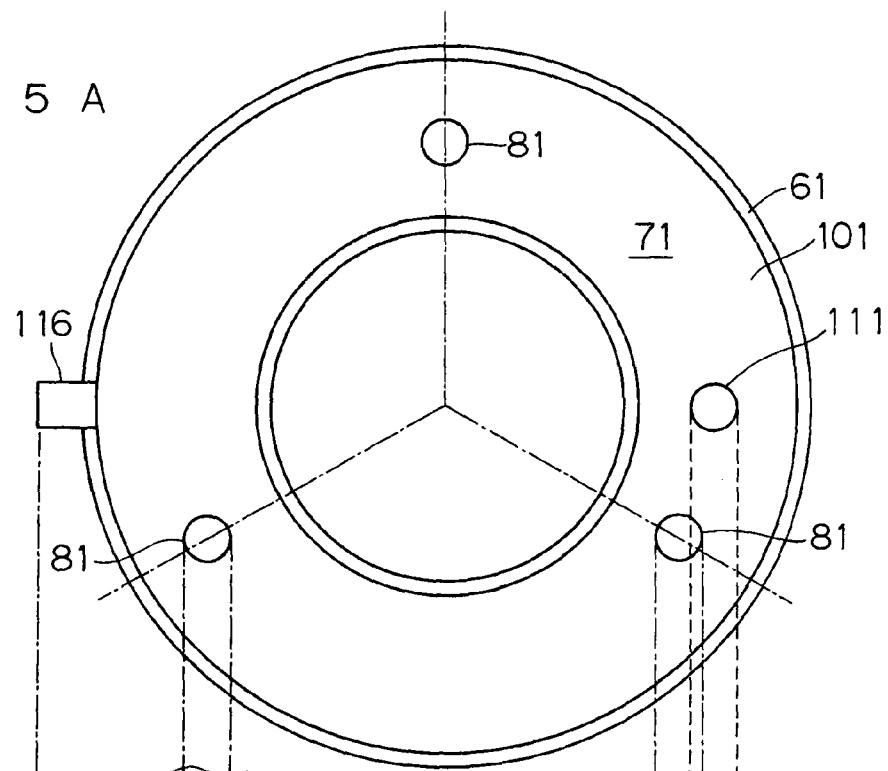
FIGS. 5A and 5B are diagrams schematically showing the configuration of a first ring of a storage part.
Figure 5B:
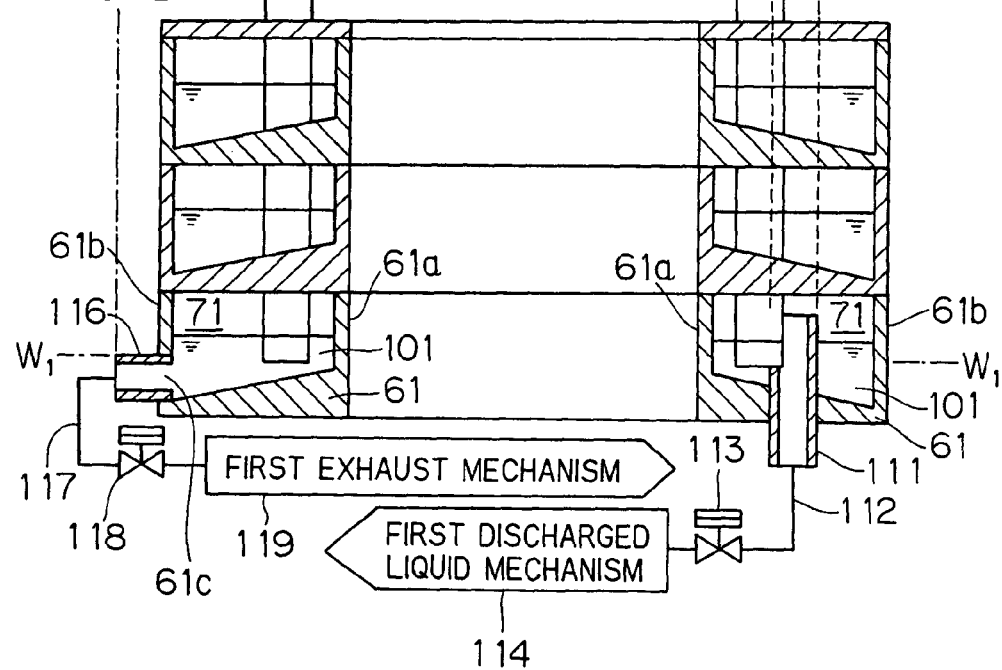

FIGS. 5A and 5B are diagrams schematically showing the first ring 61 of the storage unit 60. FIG. 5A is a sectional view of the first ring 61 as seen from line W1-W1 in FIG. 5B. In these figures, the rinsing liquid discharge pipe 84 is omitted for convenience in illustration. Referring to FIGS. 5A and 5B, the fist internal space 71 of the first ring 61 has a doughnut-like shape similar to the fourth discharged liquid tank 28d, and its upper part is sealed by the bottom of the second ring 62. The first internal space 71 of the first ring 61 is therefore usable as a storage tank to store a chemical solution.

A first exhaust pipe 111 is a pipe to exhaust the atmosphere of the first internal space 71 of the first ring 61. As shown in FIG. 5B, the first exhaust pipe 111 is disposed so as to pass through the bottom of the first ring 61 so that its upper end is close to the upper part of the first internal space 71. This avoids that when a chemical solution temporarily stored in the fourth discharged liquid tank 28d is discharged via the first chemical solution recovery pipe 81 to the first ring 61, the chemical solution is fed into the first exhaust pipe 111.

The lower end of the first exhaust pipe 111 is connected in communication to a first exhaust mechanism 114 via a pipe 112 and valve 113, so that the atmosphere of the first internal space 71 is exhausted to the exterior of the substrate processing apparatus 1. Thus, the first exhaust pipe 111 is used as an exhaust path through which the atmosphere of the first internal space 71 is exhausted to the exterior of the first internal space 71.

The first internal space 71 is, as described above, connected in communication to the recovery port 54c via the first chemical solution recovery pipe 81 and passage 54d. By exhausting the atmosphere of the first internal space 71 with use of the first exhaust mechanism 114, it is possible to exhaust the atmosphere in the vicinity of the recovery port 54c and also forcedly exhaust the chemical solution temporarily stored in the fourth discharged liquid tank 28d from the fourth discharged liquid tank 28d. This enables to exhaust the mist of the processing liquid in the vicinity of the spin base 10 to the exterior of the substrate processing apparatus 1, and also quickly exhaust the chemical solution temporarily stored in the fourth discharged liquid tank 28d to the first ring 61.

Further in the first preferred embodiment, the internal space of the fourth discharged liquid tank 28d (i.e., the space surrounded by the internal bottom of the fourth discharged liquid tank 28d, the external wall of the partition member 27c and the internal wall of the partition member 27d) and the first internal space 71 located the inside of the first ring 61 are of doughnut-type and approximately the same shape, and the both are in communication by the plurality of first chemical solution recovery pipes 81 equally spaced (arranged radially at uniform angle intervals) along the bottom of the fourth discharged liquid tank 28d (see FIG. 4).

The use of this configuration reduces the pipe resistance of a chemical solution passing through the first chemical solution recovery pipe 81. Therefore, even with the single first exhaust pipe 111 in communication to the first exhaust mechanism 114, the chemical solution can be exhausted efficiently from the fourth discharged liquid tank 28d to the first ring 61, thereby simplifying the hardware configuration related to the exhaust in the vicinity of the first ring 61.

The internal bottom of the first ring 61 is formed such that its position in a vertical direction is gradually lowered from its internal wall 61a to its external wall 61b, as shown in FIGS. 5A and 5B. The first ring 61 is connected in communication to one end of the first chemical solution discharge pipe 116 via a first outlet 61c disposed in the vicinity of the internal bottom of the external part 61b. The other end of the pipe 116 is connected in communication to a first discharged liquid mechanism 119 via a pipe 117 and valve 118. Therefore, by opening the valve 118, the used chemical solution stored in the first ring 61 can be discharged to the first discharged liquid mechanism 119. Here, the first discharged liquid mechanism 119 is a mechanism that enables to circulate and reuse a chemical solution in the substrate processing apparatus 1. That is, the first discharged liquid mechanism 119 discharges the used chemical solution to be stored in the first ring 61 to the outside of the first ring 61, and performs processes such as cleaning by removing impurities contained in the used chemical solution so that it is reusable for substrate processing.

Thus, the first ring 61 collects the atmosphere (gas) in the vicinity of the spin base 10 and the chemical solution (liquid) flying and spattering from the spin base 10 by the rotation of the substrate W. Whereas the gas is discharged via the first exhaust pipe 111 to the first exhaust mechanism 114, and the liquid is discharged via the first chemical solution discharge pipe 116 to the first discharged liquid mechanism 119. That is, the first ring 61 has a gas-liquid separation function to separate the gas and liquid contained in the first internal space 71.

Figure 6A:
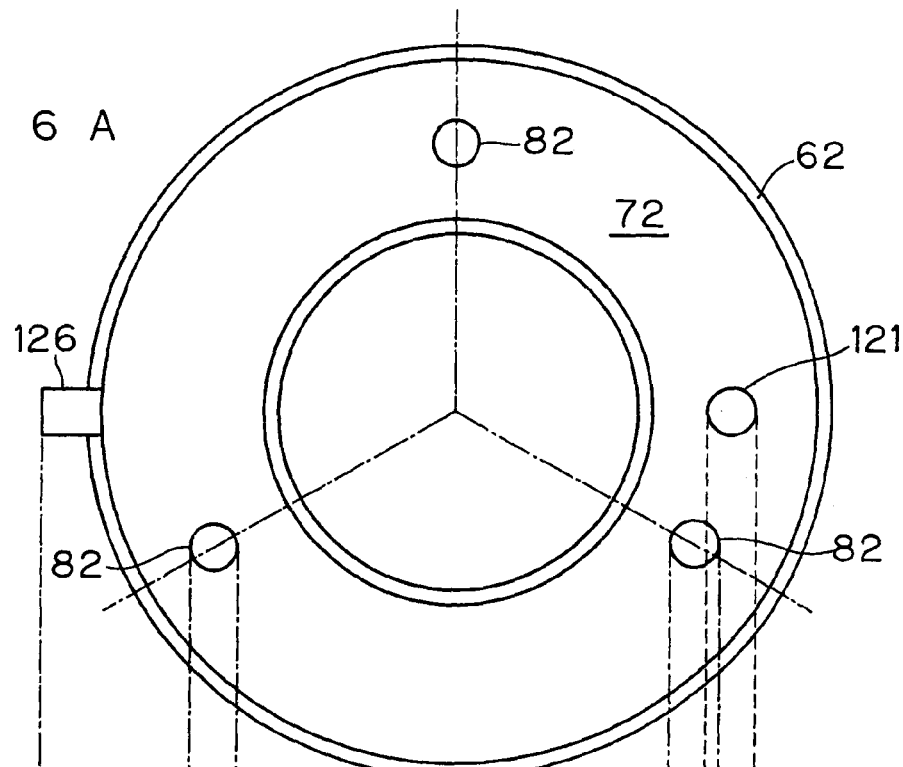
FIGS. 6A and 6B are diagrams schematically showing the configuration of a second ring of the storage part.
Figure 6B:
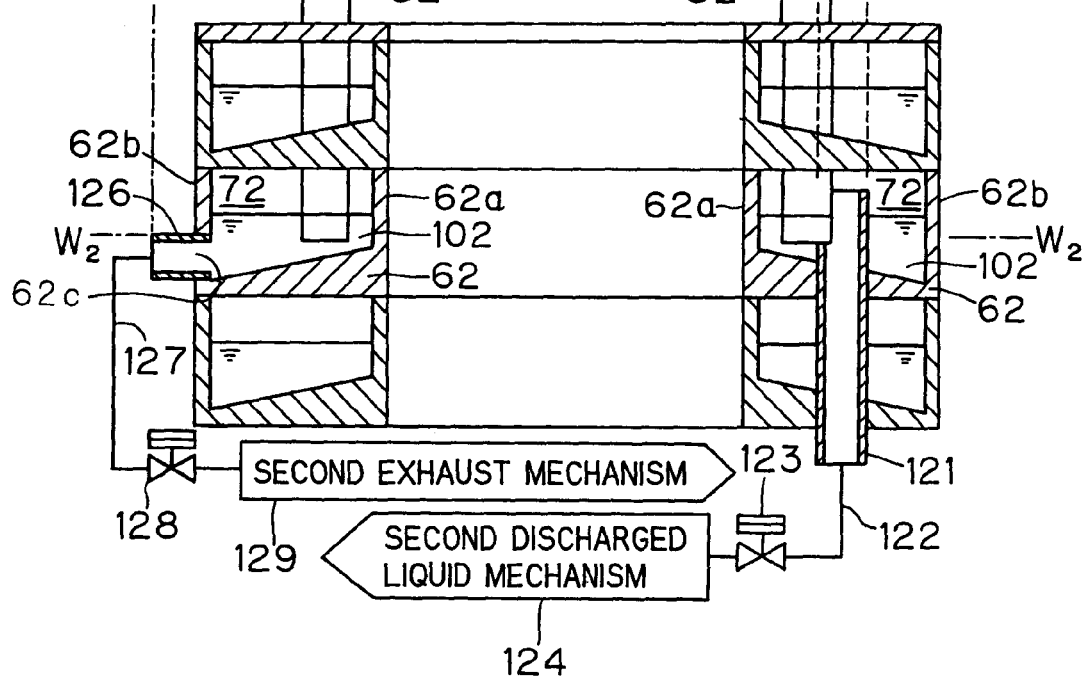

FIGS. 6A and 6B are diagrams schematically showing the second ring 62 of the storage unit 60. FIG. 6A is a sectional view of the second ring 62 as seen from line W2-W2 in FIG. 6B. In these figures, the first chemical solution recovery pipe 81 and rinsing liquid discharge pipe 84 are omitted for convenience in illustration. Referring to FIGS. 6A and 6B, the second internal space 72 of the second ring 62 has a doughnut-like shape similar to the third discharged liquid tank 28c, and its upper part is sealed by the bottom of the third ring 63. The second internal space 72 of the second ring 62 is therefore usable as a storage tank to store a chemical solution.

A second exhaust pipe 121 is a pipe to exhaust the atmosphere of the second internal space 72 of the second ring 62. As shown in FIG. 6B, the second exhaust pipe 121 is disposed so as to pass through the bottoms of the first and second rings 61 and 62 so that its upper end is close to the upper part of the second internal space 72. This avoids that when the chemical solution temporarily stored in the third discharged liquid tank 28c is discharged via the second chemical solution recovery pipe 82 to the second ring 62, the chemical solution is fed into the second exhaust pipe 121.

The lower end of the second exhaust pipe 121 is connected in communication to a second exhaust mechanism 124 via a pipe 122 and valve 123, so that the atmosphere of the second internal space 72 is exhausted to the exterior of the substrate processing apparatus 1. Thus, the second exhaust pipe 121 is used as an exhaust path through which the atmosphere of the second internal space 72 is exhausted to the exterior of the second internal space 72.

The second internal space 72 is, as described above, connected in communication to the recovery port 53d via the second chemical solution recovery pipe 82 and passage 53e. By exhausting the atmosphere of the second internal space 72 with use of the second exhaust mechanism 124, it is possible to exhaust the atmosphere in the vicinity of the recovery port 53d and also forcedly exhaust the chemical solution temporarily stored in the third discharged liquid tank 28c from the tank 28c. This enables to exhaust the mist of the processing liquid in the vicinity of the spin base 10 to the exterior of the substrate processing apparatus 1. This also enables to quickly exhaust the chemical solution that is temporarily stored in the third discharged liquid tank 28c by the suction force of the second exhaust mechanism 124, to the second ring 62.

Further in the first preferred embodiment, the internal space of the third discharged liquid tank 28c (i.e., the space surrounded by the internal bottom of the third discharged liquid tank 28c, the external wall of the partition member 27b and the internal wall of the partition member 27c) and the second internal space 72 located the inside of the second ring

62 are of doughnut-type and approximately the same shape, and the both are in communication by the plurality of second chemical solution recovery pipes 82 equally spaced (arranged radially at uniform angle intervals) along the bottom of the third discharged liquid tank 28c (see FIG. 4).

The use of this configuration reduces the pipe resistance of a chemical solution passing through the second chemical solution recovery pipe 82. Therefore, even with the single second exhaust pipe 121 in communication to the second exhaust mechanism 124, the chemical solution can be exhausted efficiently from the third discharged liquid tank 28c to the second ring 62, thereby simplifying the hardware configuration related to the exhaust in the second ring 62.

The internal bottom of the second ring 62 is formed such that its position in a vertical direction is gradually lowered from its internal wall 62a to its external wall 62b, as shown in FIGS. 6A and 6B. The second ring 62 is connected in communication to one end of the second chemical solution discharge pipe 126 via a second outlet 62c disposed in the vicinity of the internal bottom of the external wall 62b. The other end of the pipe 126 is connected in communication to a second discharged liquid mechanism 129 via a pipe 127 and valve 128. Therefore, by opening the valve 128, the used chemical solution stored in the second ring 62 can be discharged to the second discharged liquid mechanism 129. Like the first discharged liquid mechanism 119, the second discharged liquid mechanism 129 is a mechanism of discharging the used chemical solution to be stored in the second ring 62 to the outside of the second ring 62, and performing processes such as cleaning by removing impurities contained in the used chemical solution so that it is reusable for substrate processing.

Further, like the first ring 61, the second ring 62 collects the atmosphere (gas) in the vicinity of the spin base 10 and the chemical solution (liquid) flying spattering from the spin base 10 by the rotation of a substrate W, and also has a gas-liquid separation function to separate these gas and liquid.

Figure 7A:
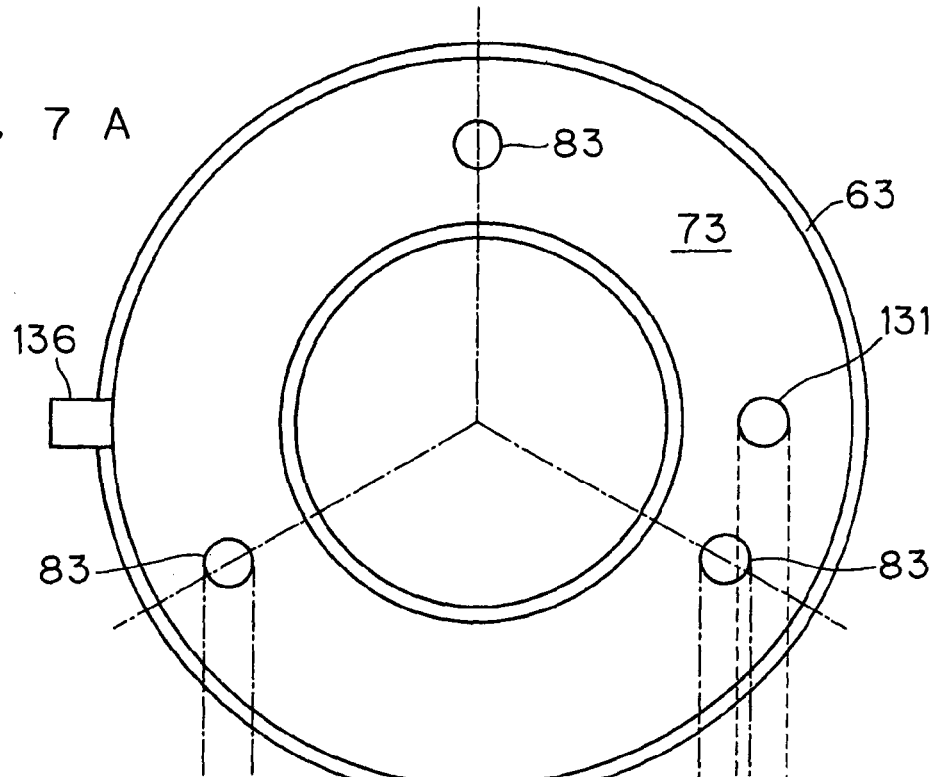
FIGS. 7A and 7B are diagrams schematically showing the configuration of a third ring of the storage part.
Figure 7B:
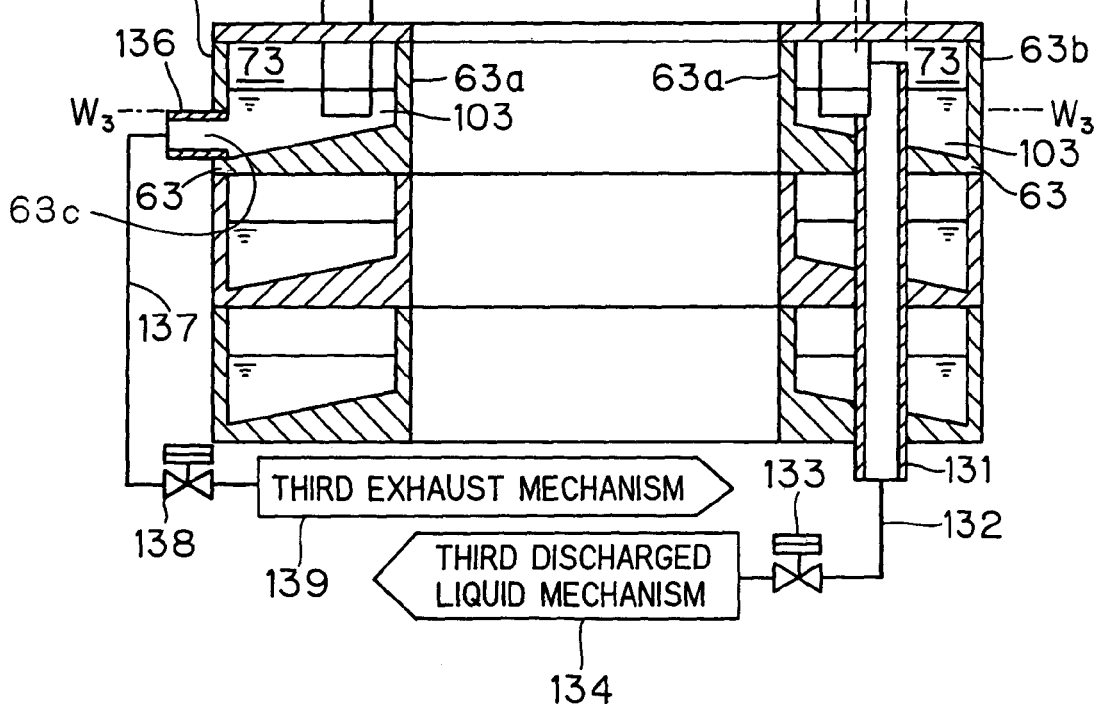

FIGS. 7A and 7B are diagrams schematically showing the third ring 63 of the storage unit 60. FIG. 7A is a sectional view of the third ring 63 as seen from line W3-W3 in FIG. 7B. In these figures, the first chemical solution recovery pipe 81, second chemical solution recovery pipe 82 and rinsing liquid discharge pipe 84 are omitted for convenience in illustration. Referring to FIGS. 7A and 7B, the third internal space 73 of the third ring 63 has a doughnut-like shape similar to the second discharged liquid tank 28b, and its upper part is sealed by the plate-like member 64. The third internal space 73 of the third ring 63 is therefore usable as a storage tank to store a chemical solution.

A third exhaust pipe 131 is a pipe to exhaust the atmosphere of the third internal space 73 of the third ring 63. As shown in FIG. 7B, the third exhaust pipe 131 is disposed so as to pass through the bottoms of the first, second and third rings 61, 62 and 63 so that its upper end is close to the upper part of the third internal space 73. This avoids that when a chemical solution temporarily stored in the second discharged liquid tank 28b is discharged via the third chemical solution recovery pipe 83 to the third ring 63, the chemical solution is fed into the third exhaust pipe 131.

The lower end of the third exhaust pipe 131 is connected in communication to a third exhaust mechanism 134 via a pipe 132 and valve 133, so that the atmosphere of the third internal space 73 is exhausted to the exterior of the substrate processing apparatus 1. Thus, the third exhaust pipe 131 is used as an exhaust path through which the atmosphere of the third internal space 73 is exhausted to the exterior of the third internal space 73.

The third internal space 73 is, as described above, connected in communication to the recovery port 52f via the third chemical solution recovery pipe 83 and passage 52g. By exhausting the atmosphere of the third internal space 73 with use of the third exhaust mechanism 134, it is possible to exhaust the atmosphere in the vicinity of the recovery port 52f and also forcedly exhaust the chemical solution temporarily stored in the second discharged liquid tank 28b from the tank 28b. This enables to exhaust the mist of the processing liquid in the vicinity of the spin base 10 to the exterior of the substrate processing apparatus 1. This also enables to quickly exhaust the chemical solution that is temporarily stored in the second discharged liquid tank 28b by the suction force of the second exhaust mechanism 124, to the third ring 63.

Further in the first preferred embodiment, the internal space of the second discharged liquid tank 28b (i.e., the space surrounded by the internal bottom of the second discharged liquid tank 28b, the external wall of the partition member 27a and the internal wall of the partition member 27b) and the third internal space 73 located the inside of the third ring 63 are of doughnut-type and approximately the same shape, and the both are in communication by the plurality of third chemical solution recovery pipe 83 equally spaced (arranged radially at uniform angle intervals) along the bottom of the second discharged liquid tank 28b (see FIG. 4).

The use of this configuration reduces the pipe resistance of a chemical solution passing through the third chemical solution recovery pipe 83. Therefore, even with the single third exhaust pipe 131 in communication to the third exhaust mechanism 134, the chemical solution can be exhausted efficiently from the second discharged liquid tank 28b to the third ring 63, thereby simplifying the hardware configuration related to the exhaust in the third ring 63.

The internal bottom of the third ring 63 is formed such that its position in a vertical direction is gradually lowered from its internal wall 63a to its external 63b, as shown in FIGS. 7A and 7B. The third ring 63 is connected in communication to one end of the third chemical solution discharge pipe 136 via a third outlet 63c disposed in the vicinity of the internal bottom of the external wall 63b. The other end of the pipe 136 is connected in communication to a third discharged liquid mechanism 139 via a pipe 137 and valve 138. Therefore, by opening the valve 138, the used chemical solution stored in the third ring 63 can be discharged to the third discharged liquid mechanism 139. Like the first and second discharged liquid mechanisms 119 and 129, the third discharged liquid mechanism 139 is a mechanism of discharging the used chemical solution to be stored in the third ring 63 to the outside of the third ring 63, and performing processes such as cleaning by removing impurities contained in the used chemical solution so that it is reusable for substrate processing.

Thus, like the first and second rings 61 and 62, the third ring 63 collects the atmosphere (gas) in the vicinity of the spin base 10 and the chemical solution (liquid) flying and spattering from the spin base 10 by the rotation of a substrate W, and also has a gas-liquid separation function to separate these gas and liquid.

The combinations of the first chemical solution recovery pipe 81 and first ring 61; second chemical solution recovery pipe 82 and second ring 62; and third chemical solution recovery pipe 83 and third internal space 73 are configured as a storage part to store chemical solutions that are discharged from their corresponding fourth discharged liquid tank 28d, third discharged liquid tank 28c and second discharged liquid tank 28b, respectively.

Depending on the type of chemical solution, the first to third rings 61 to 63 may be used suitably so that the first chemical solution is recovered by the third ring 63, the second chemical solution is recovered by the second ring 62, and the third chemical solution is recovered by the first ring 61.

Returning to FIG. 2, the splash guard 50 is disposed above the receiving member 26. The splash guard 50 is disposed so as to annularly circumscribe a substrate W held in its horizontal position above the spin base 10. The splash guard 50 has a four-stage structure consisting of four guards 51 to 54 that are arranged coaxially with the spin base 10 and, in inner-to-outer order, 51, 52, 53 and 54, and in order of their decreasing height, there are 54, 53, 52 and 51. The upper end parts of the guards 51 to 54 are located within a substantially vertical plane.

The guard 51 is composed of: (i) a cylindrical part 51b arranged coaxially with the spin base 10; (ii) a projected part 51a that projects obliquely above from the upper end of the cylindrical part 51b to the central side (the side of the spin base 10); (iii) an inclined part 51c extending obliquely downwardly to the center from the lower end of the cylindrical part 51b; (iv) a cylindrical part 51e extending vertically downwardly to the same internal diameter from the lower end of the cylindrical part 51b; and (v) a cylindrical part 51d extending vertically downwardly from the lower end of the inclined part 51c. The cylindrical part 51e is located outside the cylindrical part 51d, and the space between the cylindrical parts 51e and 51d serves as a cylindrical groove 51h.

The inside of the guard 51, namely the area surrounded by the projected part 51a, cylindrical part 51b and inclined part 51c, serves as the guide part 51f (first guide part). The cross section of the guide part 51f is of substantially U-shape that is opened toward the center of the splash guard 50.

The guard 52 is composed of: (i) a cylindrical part 52b arranged coaxially with the spin base 10; (ii) a projected part 52a that projects obliquely above to the center from the upper end of the cylindrical part 51b; (iii) an inclined part 52c extending obliquely downwardly on the center from the lower end of the cylindrical part 52b; (iv) a cylindrical part 52d that branches from the lower end of the inclined part 52c and extends vertically downwardly; and (v) a cylindrical part 52e that branches from the lower end of the inclined part 52c to the outside of the cylindrical part 52d and extends vertically downwardly. The cylindrical part 52e is located outside the cylindrical part 52d, and the space between the cylindrical parts 52e and 52d serves as a cylindrical groove 52h.

The guard 53 is composed of: (i) a cylindrical part 53b arranged coaxially with the spin base 10; (ii) a projected part 53a that projects obliquely above to the center from the upper end of the cylindrical part 53b; and (iii) a cylindrical part 53c that is provided fixedly so as to branch from the internal wall surface of the cylindrical part 53b. The cylindrical part 53b is located outside the cylindrical part 53c, and the space between the cylindrical parts 53b and 53c serves as a cylindrical groove 53f.

The guard 54 is composed of a cylindrical part 54b arranged coaxially with the spin base 10, and a projected part 54a that projects obliquely above to the center from the upper end of the cylindrical part 54b.

The space between the projected parts 51a and 52a, namely the area surrounded by the projected part 52a, cylindrical part 52b, inclined part 52c and projected part 51a, servers as a recovery port 52f (second guide part). The space between the projected parts 52a and 53a serves as a recovery port 53d (third guide part). Likewise, the space between the projected parts 53a and 54a serves as a recovery port 54c (fourth guide part). The recovery ports 54c, 53d, 52f and guide part 51f are of annular shape coaxially with the spin base 10, and they receive, on the side of a substrate W held by the spin base 10, the processing liquid flying spattering from the substrate W in rotation.

As shown in FIG. 2, from top to bottom, the recovery ports 54c, 53d and 52f, and guide part 51f are stacked in multistage and in the order named. In other words, in a vertical direction, the inside of the guard 51, the space between the guards 51 and 52, the space between the guards 52 and 53, and the space between the guards 53 and 54 serve as the guide part 51f, recovery port 52f, recovery port 53d and recovery port 54, respectively.

Note that in the first preferred embodiment the guide part 51f is used to receive the rinsing liquid flying spattering from a substrate W in rotation, and the recovery ports 52f, 53d and 54c are used to receive the chemical solution flying spattering from the substrate W in rotation. It is therefore so configured as to stack in multistage the recovery ports 52f, 53d and 54c, each receiving the chemical solution, on the guide part 51f receiving the rinsing liquid.

On the other hand, the area extending along the internal wall surface of the cylindrical part 51d serves as a first passage 51g. The space between the external wall surface of the cylindrical part 51e and the internal wall surface of the cylindrical part 52d serves as a second passage 52g. The space between the external surface of the cylindrical part 52e and the internal wall surface of the cylindrical part 53c serves as a third passage 53e. The space between the external wall surface of the cylindrical part 53b and the internal wall surface of the cylindrical part 54b serves as a fourth passage 54d.

Referring to FIG. 2, the first passage 51g, second passage 52g, third passage 53e and fourth passage 54d are arranged in inner-to-outer order, and the first passage 51g, second passage 52g, third passage 53e and fourth passages 54d are of cylindrical shape arranged coaxially. In other words, in a horizontal direction, the inside of the guard 51, the space between the guards 51 and 52, the space between the guards 52 and 53, and the space between the guards 53 and 54 serve as the first passage 51g, second passage 52g, third passage 53e and fourth passage 54, respectively. Note that a coupling member (not shown) is provided at a certain location on each of the cylindrical second, third and fourth passages 52g, 53e and 54d. These coupling members couple the guards 51 to 54 adjacent to one another, and the guards 51 to 54 integrally configure the splash guard 50.

The first passage 51g is connected in communication to the guide part 51f and feeds downward the rinsing liquid received by the guide part 51f. The second passage 52g is connected in communication to the recovery port 52f and feeds downward the chemical solution received by the recovery port 52f. The third passage 53e is connected in communication to the recovery port 53d and feeds downward the chemical solution received by the recovery port 53d. The fourth passage 54d is connected in communication to the recovery port 54c and feeds downward the chemical solution received by the recovery port 54c. That is, the first passage 51g, second passage 52g, third passage 53e and fourth passage 54d correspond to the guide part 51f, recovery port 52f, recovery port 53d and recovery port 54c, respectively, so that they feed downward the processing liquid fed through their corresponding guide parts.

Figure 9:
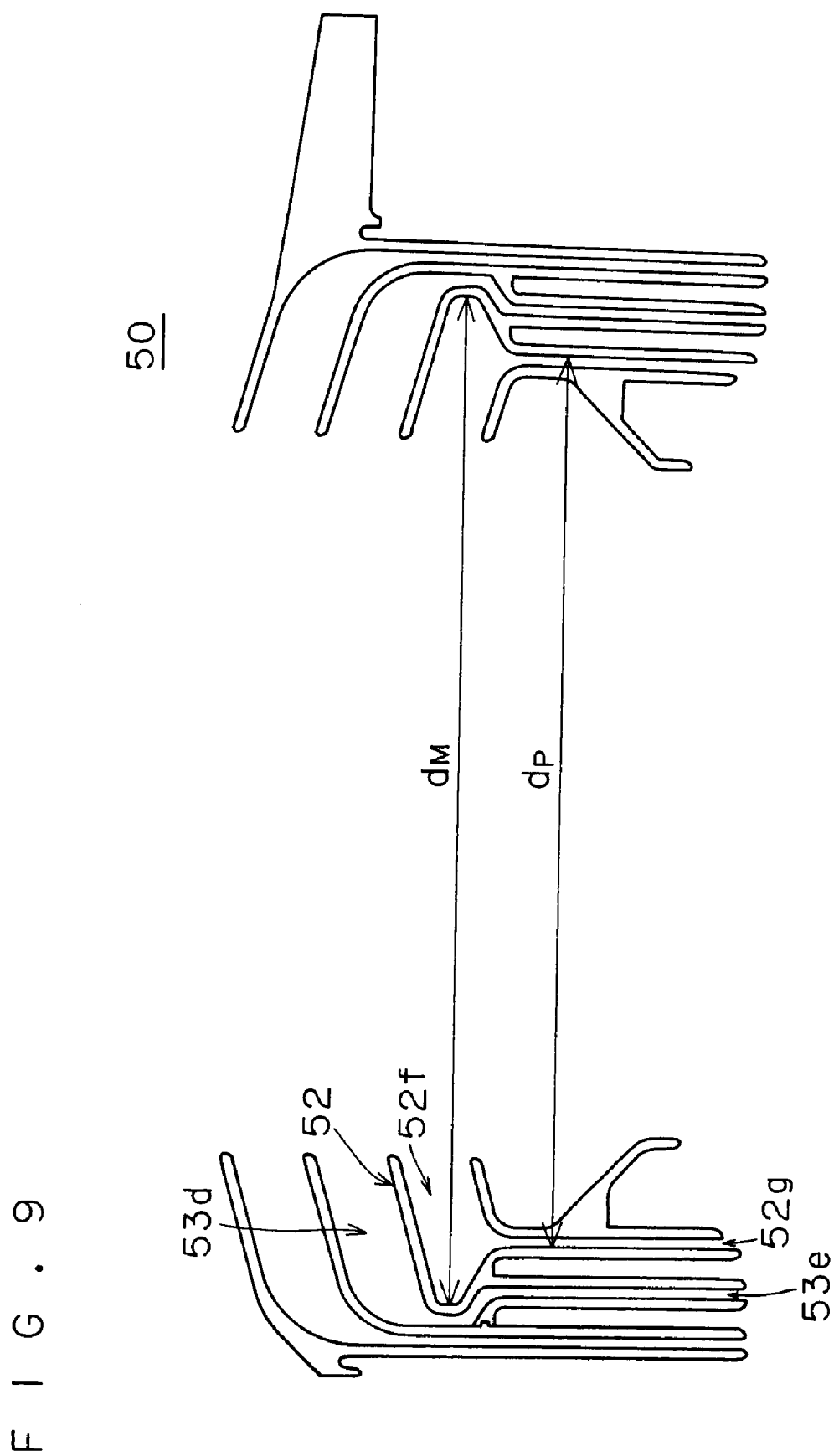
FIG. 9 is a diagram showing a splash guard.

Referring now to FIG. 9, the guard 52 is curved such that the maximum internal diameter $d_M$ of the recovery port 52f that is the lowermost stage in the guide parts receiving chemical solutions (i.e., the internal diameter of the cylindrical part 52b) is greater than the internal diameter $d_P$ of the second passage 52g that is the processing liquid passage corresponding to the recovery port 52f. From a different standpoint, the guard 52 is curved such that the recovery port 52f that is the lowermost stage in the guide parts receiving chemical solutions covers above of the third passage 53e that is the processing liquid passage corresponding to the recovery port 53d that serves as the chemical solution guide part immediately above the recovery port 52f. More specifically, the guard 52 is curved such that the vertical cross section of the recovery port 52f is of substantially U-shape opening toward the center of the splash guard 50, so that the maximum internal diameter part of the recovery port 52f (i.e., the cylindrical part 52b) is brought near the guard 53.

Returning to FIG. 2, the splash guard 50 is coupled to a guard lifting mechanism 55 via a link member (not shown), and can be lifted and lowered along a vertical direction by the guard lifting mechanism 55. As a guard lifting mechanism 55, there may be employed any of various known mechanisms, such as feed screw mechanism using ball screw and mechanism using air cylinder.

Figure 11:
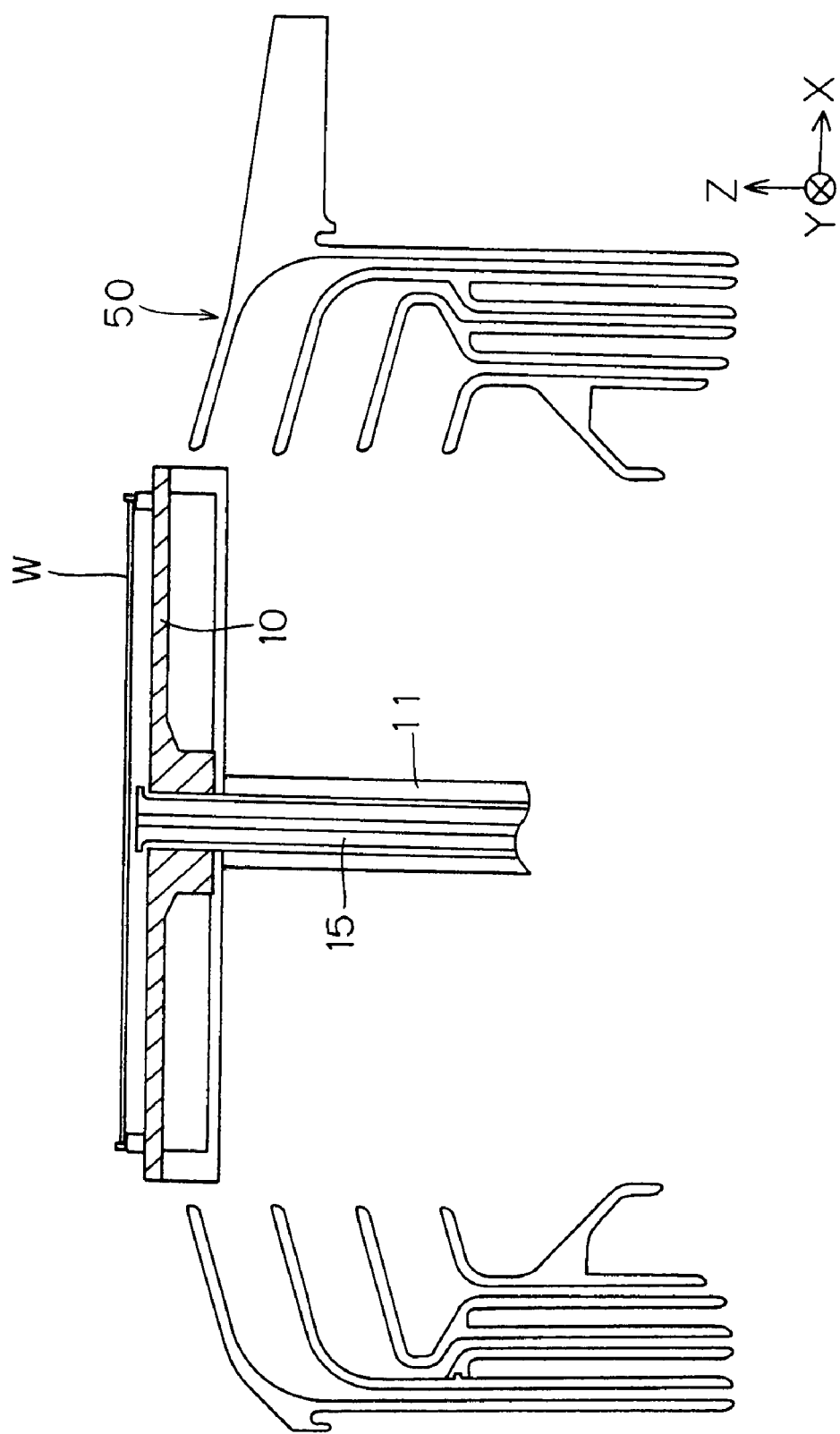
FIG. 11 is a diagram showing other example of the relationship between the splash guard and the height of the spin base.

When the guard lifting mechanism 55 lowers the splash guard 50 from the position shown in FIG. 2, the partition members 27b and 27c slidably engage grooves 52h and 53f, respectively, and then the partition member 27a slidably engages a groove 51h. In the state that the splash guard 50 is in its lowermost position, the spin base 10 projects beyond the upper end of the splash guard 50, as shown in FIG. 11. In this state, a transport robot (not shown) can transfer a substrate W with respect to the spin base 10.

On the other hand, when the guard lifting mechanism 55 lifts the splash guard 50 up to its uppermost position, the partition members 27a, 27b and 27c separate from the grooves 51h, 52h and 53f, respectively, so that the guide part 51f is positioned around the spin base 10 and the periphery of the substrate W held by the spin base 10. This is a condition where a rinsing process is performed. That is, the rinsing liquid flying spattering from the substrate W in rotation is received by the guide part 51f and introduced from the guide part 51f to the first passage 51g. Then this rinsing liquid flows down to the first discharged liquid tank 28a along the first passage 51. The rinsing liquid fed in the first discharged liquid tank 28a is then discharged to the rinsing liquid discharge pipe 84.

Figure 10:
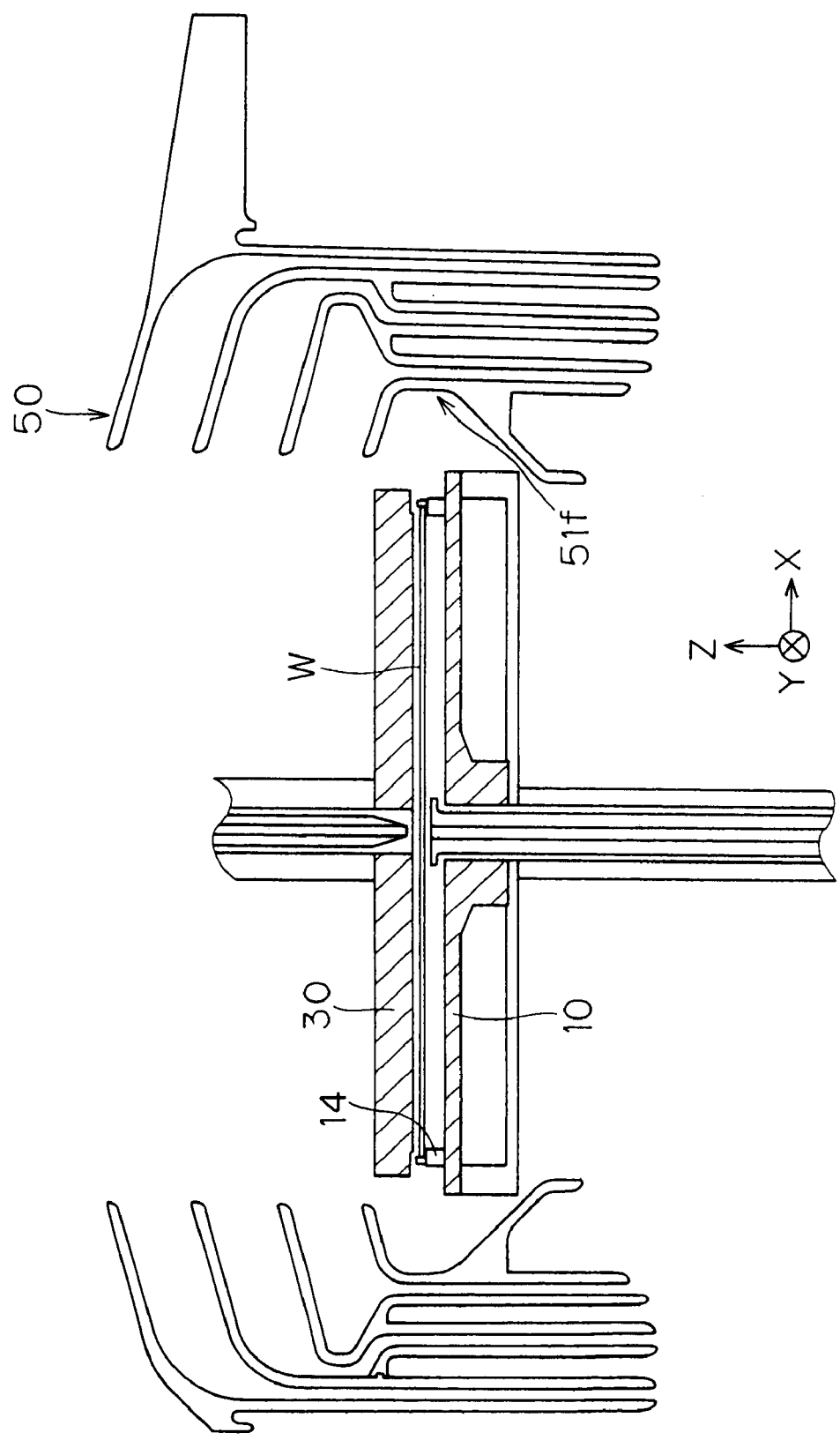
FIG. 10 is a diagram showing one example of the relationship between the splash guard and the height of a spin base.

When the guard lifting mechanism 55 lowers slightly the splash guard 50 from the condition shown in FIG. 10, the recovery port 52f is positioned around the spin base 10 and the periphery of the substrate W held by the spin base 10 (see FIG. 2). This is a condition where a chemical solution process using a first chemical solution is performed, and also a case where the first chemical solution is recovered to reuse. The first chemical solution flying spattering from the substrate W in rotation is received by the recovery port 52f and introduced from the recovery port 52f to the second passage 52g. Then this flows down to the second discharged liquid tank 28b along the second passage 52g. The first chemical solution fed in the second discharged liquid tank 28b is then discharged to the third chemical solution recovery pipe 83.

When the guard lifting mechanism 55 further lowers slightly the splash guard 50 from the condition shown in FIG. 2, the recovery port 53d is positioned around the spin base 10 and the periphery of the substrate W held by the spin base 10. This is a condition where a chemical solution process using a second chemical solution is performed, and also a case where the second chemical solution is recovered to reuse. The second chemical solution flying spattering from the substrate W in rotation is received by the recovery port 53d and introduced from the recovery port 53d to the third passage 53e. Then this flows down to the third discharged liquid tank 28c along the third passage 53e. The second chemical solution fed in the third discharged liquid tank 28c is then discharged to the second chemical solution recovery pipe 82.

Likewise, when the guard lifting mechanism 55 further lowers slightly the splash guard 50, the recovery port 54c is positioned around the spin base 10 and the periphery of the substrate W held by the spin base 10. This is a condition where a chemical solution process using a third chemical solution is performed, and also a case where the third chemical solution is recovered to reuse. The third chemical solution flying spattering from the substrate W in rotation is received by the recovery port 54c and introduced from the recovery port 54c to the fourth passage 54d. Then this flows down to the fourth discharged liquid tank 28d along the fourth passage 54d. The third chemical solution fed in the fourth discharged liquid tank 28d is then discharged to the first chemical solution recovery pipe 81.

Thus, the guard lifting mechanism 55 controls the physical relationship between the substrate held by the spin base 10 and the individual guide parts such that a processing liquid flying spattering from the substrate W in rotation is received by a guide part corresponding to the recovery type of the processing liquid (e.g., recovery according to the type of processing liquid, recovery for dumping, recovery for recovering to reuse).

Disposed above the spin base 10 is the atmosphere blocking plate 30 that is opposed to the upper surface of a substrate W held by the spin base 10. The atmosphere blocking plate 30 is a disk-like member having a diameter slightly greater than the diameter of the substrate W and smaller than the diameter of an upper opening of the splash guard 50. The atmosphere blocking plate 30 has at its center an opening.

The rotary axis 35 is vertically disposed on the upper side of the center of the atmosphere blocking plate 30. The rotary axis 35 is a hollow cylindrical member. The processing liquid upper nozzle 36 is inserted in a hollow part on the inside of the rotary axis 35. A rotatable drive mechanism 42 is cooperatively coupled to the rotary axis 35. The rotatable drive mechanism 42 is configured by a electric motor and a torque transmitting mechanism that transmits the rotation of the electric motor to the rotary axis 35, so that the rotary axis 35 and atmosphere blocking plate 30 are rotated in a horizontal plane about axis J along a vertical direction. As the result, the atmosphere blocking plate 30 can be rotated coaxially with and in substantially parallel to the substrate W, and also rotated approximately the same number of revolutions as the substrate W.

The processing liquid upper nozzle 36 extends through the rotary axis 35 and its top part 36a is located immediately above the center of the substrate W held by the spin base 10. The bottom portion of the processing liquid upper nozzle 36 is connected in communication to a processing liquid pipe 37. As shown in FIG. 3, the bottom portion of the processing liquid pipe 37 is divided into four branches: a branch pipe 37a to which a first chemical solution supply source 17a is connected in communication; branch pipe 37b to which a second chemical solution supply source 17b is connected in communication; branch pipe 37c to which a third chemical solution supply source 17c is connected in communication; and branch pipe 37d to which a pure water supply source 18 is connected in communication. The branch pipes 37a, 37b, 37c and 37d are provided with valves 38a, 38b, 38c and 38d, respectively. By changing the opening and closing of these valves 38a to 38d, the first, second and third chemical solutions and rinsing liquid are selectively discharged or supplied from the top portion 36a of the processing liquid upper nozzle 36 to the vicinity of the center of the upper surface of the substrate W held by the chuck pins 14.

Specifically, the first chemical solution can be supplied from the processing liquid upper nozzle 36 by opening the valve 38a and closing other valves. The second chemical solution can be supplied from the processing liquid upper nozzle 36 by opening the valve 38b and closing other valves. The third chemical solution can be supplied from the processing liquid upper nozzle 36 by opening the valve 38c and closing other valves. The rinsing liquid can be supplied from the processing liquid upper nozzle 36 by opening the valve 38d and closing other valves.

A gas supply path 45 is made of the internal wall of the hollow part of the rotary axis 35 and the space between the internal wall of the opening located centrally of the atmosphere blocking plate 30 and the external wall of the processing liquid upper nozzle 36. A top portion 45a of the gas supply path 45 is directed to the center of the upper surface of the substrate W held by the spin base 10. The bottom portion of the gas supply path 45 is connected in communication to a gas pipe 46. The gas pipe 46 is, as shown in FIG. 3, connected in communication to an inert gas supply source 23. A valve 47 is provided in the course of the gas pipe 46. By opening the valve 47, an inert gas (nitrogen gas in this embodiment) can be supplied from the top portion 45a of the gas supply path 45 to the center of the upper surface of the substrate W held by the spin base 10.

The atmosphere blocking plate 30 can be lifted and lowered along a vertical direction by a lifting mechanism 49. As a lifting mechanism 49, there can be employed any of various known mechanisms, such as feed screw mechanism using a ball screw and mechanism using air cylinder. For example, there may be so configured that the rotary axis 35 and rotatable drive mechanism 42 are housed in a support arm and the entire support arm is lifted or lowered by the lifting mechanism 49. The lifting mechanism 49 lifts and lowers the support arm to thereby integrally lift and lower the rotary axis 35 and atmosphere blocking plate 30 coupled to the support arm. More specifically, the lifting mechanism 49 lifts and lowers the atmosphere blocking plate 30 between a position close to the upper surface of the substrate W held by the spin base 10 and a position far apart upwardly from the upper surface of the substrate W. When the atmosphere blocking plate 30 is brought near the upper surface of the substrate W held by the spin base 10, it covers the entire upper surface of the substrate W.

FIG. 8 is a block diagram showing the configuration of a control system of the substrate processing apparatus 1. The substrate processing apparatus 1 is provided with a control part 99 composed of a computer with a CPU and memory etc. The control part 99 is electrically connected to the rotatable drive mechanisms 20, 42, lifting mechanism 49, guard lifting mechanism 55 and individual valves, in order to control their respective operations. The control part 99 is also connected to a sensor (not shown) to detect the height position of the splash guard 50. The control part 99 recognizes the height position of the splash guard 50 on the basis of an output signal from the sensor and then controls the guard lifting mechanism 55 to set the splash guard 50 at a desired height.

1-2. Procedure of Substrate Process

The following is procedure in processing a substrate W in the substrate processing apparatus 1 so configured. A basic procedure in this apparatus is that after the substrate W is subjected to etching process with a chemical solution, there is performed a rinsing process of washing the chemical solution by a rinsing liquid, followed by a spin dry process of shaking off droplets by spinning the substrate W. In the first preferred embodiment, a bevel etching of the peripheral part of the substrate W is to be performed by using the first chemical solution.

First, the splash guard 50 is lowered so that the spin base 10 projects beyond the splash guard 50 (see FIG. 11), and the atmosphere blocking plate 30 is considerably lifted so as to be far apart from the spin base 10. In this state, a transport robot (not shown) gives an untreated substrate W to the spin base 10. Then, the chuck pins 14 grip the peripheral part of the given substrate W to thereby hold the substrate W in its horizontal position.

Subsequently, the splash guard 50 is lifted so that it is positioned around the spin base 10 and the periphery of the substrate W held by the spin base 10, and the atmosphere blocking plate 30 is lowered so that it is brought near the substrate W. Note that the atmosphere blocking plate 30 is not in contact with the substrate W. At this time, the control part 99 controls the guard lifting mechanism 55 to adjust the physical relationship between the substrate W held by the spin base 10 and the splash guard 50, namely, to control the height position of the splash guard 50, such that the processing liquid flying spattering from the substrate W that is rotated during the etching process is received by a guide part corresponding to the type of recovery of the processing liquid. Since the type of recovery in this embodiment is to recover the first chemical solution for its reuse, the corresponding guide part is the recovery port 52f, and the guard lifting mechanism 55 lifts the splash guard 50 such that the recovery port 52f is positioned around the spin base 10 and the periphery of the substrate W held by the spin base 10 (see FIG. 2).

Subsequently, the spin base 10 and the substrate W held by the spin base 10 are rotated. The atmosphere blocking plate 30 is also rotated. In this state, a chemical solution is discharged from the processing liquid lower nozzle 15 only to the lower surface of the substrate W. The chemical solution discharged from the processing liquid lower nozzle 15 spreads over the lower surface of the substrate W by centrifugal force. Part of this chemical solution reaches the peripheral part of the upper surface of the substrate W to thereby execute an etching process (bevel etching) of the peripheral part of the upper surface of the substrate W. During the etching process, a small amount of nitrogen gas may be discharged through the gas supply path 19 and gas supply path 45 in order to prevent the back flow of the chemical solution to the gas supply paths 19 and 45.

The first chemical solution flying spattering from the substrate W in rotation during the etching process is received by the recovery port 52f and introduced from the recovery port 52f to the second passage 52g. Then, along the second passage 52g, it flows down to the second discharged liquid tank 28b and is stored there temporarily. Thereafter, from the three third outlets 93 disposed in the bottom of the second discharged liquid tank 28b, the first chemical solution stored in the second discharged liquid tank 28b is quickly discharged through the third chemical solution recovery pipe 83 and then stored in the third ring 63 disposed apart from the spin base 10. This reduces the time that the first chemical solution stays in the vicinity of the substrate W, thus permitting satisfactory substrate process.

The atmosphere containing the processing liquid mist in the vicinity of the spin base 10 is forcedly exhausted to the third internal space 73 of the third ring 63 by opening the valve 133 and operating the third exhaust mechanism 134. In this manner, the processing liquid mist floating in the vicinity of the spin base 10 can be removed from the vicinity of the substrate W. This avoids that the processing liquid mist causes poor substrate process.

Then, the chemical solution and the atmosphere containing the processing liquid mist so collected in the third ring 63 are separated from each other. The used chemical solution is discharged to the outside of the third ring 63 by the third discharged liquid mechanism 139, and further subjected to a process of eliminating impurities and the like, so that it is reusable for substrate process. The atmosphere containing the processing liquid mist is exhausted through the third exhaust mechanism 134 to an exhaust drain (not shown).

After the etching process for a predetermined period of time is completed, the chemical solution discharge from the processing liquid lower nozzle 15 is stopped and the splash guard 50 is slightly lifted such that the cylindrical part 51*b* disposed on the inner peripheral surface of the guide part 51*f* has approximately the same height as the chuck pins 14 vertically disposed in the spin base 10 (see FIG. 10). The atmosphere blocking plate 30 is maintained at a slightly higher position than in the etching process. In this state, the valve 38*d* and valve 12*d* (see FIG. 3) are opened while rotating the substrate W, so that a rinsing liquid is discharged to the upper and lower surfaces of the substrate W from the processing liquid upper nozzle 36 and processing liquid lower nozzle 15. The discharged rinsing liquid extends to the entire surfaces of the upper and lower surfaces of the substrate W by centrifugal force, thereby executing a washing process (rinsing process) to wash the chemical solution by the rinsing liquid.

The rinsing liquid flying spattering from the substrate W in rotation during the rinsing process is received by the guide part 51*f* of the splash guard 50 and introduced from the guide part 51*f* to the first passage 51*g*. Then, along the first passage 51*g*, it flows down to the first discharged liquid tank 28*a* and is stored there temporarily. Thereafter, from four rinsing liquid outlets 94 disposed in the bottom of the first discharged liquid tank 28*a*, the rinsing liquid stored in the first discharged liquid tank 28*a* is quickly discharged through the rinsing liquid recovery pipe 84, and then discarded to the discharged liquid drain 88 disposed apart from the spin base 10.

In this preferred embodiment, pure water is used as a rinsing liquid. In an alternative, a small amount of nitrogen gas may be discharged from the gas supply path 19 and gas supply path 45 during the rinsing process, in order to avoid the back flow of the rinsing liquid to the gas supply paths 19 and 45.

After the rinsing process for a predetermined period of time is completed, the rinsing liquid discharge from the processing liquid upper nozzle 36 and processing liquid lower nozzle 15 is stopped and the splash guard 50 is lowered such that the spin base 10 slightly projects beyond the splash guard 50. The atmosphere blocking plate 30 is maintained near the substrate W. In this state, through the gas supply path 19 and gas supply path 45, nitrogen gas is discharged and sprayed to the upper and lower surfaces of the substrate W, while rotating the substrate W. The discharged nitrogen gas passes through the space between the spin base 10 and the substrate W, and the space between the atmosphere blocking plate 30 and the substrate W, so that the surroundings of the substrate W is made into an atmosphere of low oxygen concentration. Under the atmosphere of low oxygen concentration with the supplied nitrogen gas, the droplets attached to the substrate W are shaken off by the centrifugal force developed by the rotation, thereby executing shake dry process (spin dry process).

After the spin dry process for a predetermined period of time is completed, the rotations of the spin base 10 and the substrate W held by the spin base 10 are stopped. The rotation of the atmosphere blocking plate 30 is also stopped and the atmosphere blocking plate 30 is lifted so as to be apart from the spin base 10. In this state, a transport robot (not shown) takes and unloads the treated substrate W out of the spin base 10, thereby completing a sequence of substrate processes.

1-3. Advantages of Substrate Processing Apparatus

Firstly, in the substrate processing apparatus of the first preferred embodiment, the guard 52 is curved such that the vertical cross section of the recovery port 52*f* is of substantially U-shape opening toward the center of the splash guard 50, in order that the maximum internal diameter part of the recovery port 52*f* (the cylindrical part 52*b*) is brought near the guard 50. Therefore, the space between the internal wall of the recovery port 52*f* and the substrate W held by the spin base 10 is increased to thereby suppress the bounce of the first chemical solution flying spattering from the substrate W that is held by the spin base 10 and rotated. This avoids that the bounced droplets attach to the substrate W and become a pollutant such as particles.

Secondly, in the substrate processing apparatus 1 of the first preferred embodiment, the chemical solution flying spattering by the rotation of the substrate W is temporarily stored in the second to fourth discharged liquid tanks 28*b* to 28*d*. Thereafter, it is discharged to the corresponding one of the first, second and third rings 61, 62 and 63, disposed apart from the spin base 10. The rinsing liquid temporarily stored in the first discharged liquid tank 28*a* is quickly discharged through the cleaning liquid discharge pipe 84 to the discharged liquid drain 88 that is placed outside the substrate processing apparatus 1. It is therefore possible to reduce the time that the chemical solution and rinsing liquid retain in the first to fourth discharged liquid tanks 28*a* to 28*d*. This avoids that poor process of the substrate W occurs under the influence of the chemical solution and rinsing liquid remaining in the discharged liquid tanks 28*a* to 28*d*.

Thirdly, by the first, second and third exhaust mechanism 114, 124 and 134, the atmosphere in the vicinity of the spin base 10 can forcedly be collected in the corresponding first, second and third rings 61, 62 and 63, respectively. Therefore, the atmosphere containing the processing liquid mist can effectively be eliminated from the vicinity of the substrate W, thereby avoiding poor process of the substrate W.

Fourthly, the first, second and third chemical solution recovery pipes 81, 82 and 83 connect in communication between the fourth discharged liquid tank 28*d* and first ring 61, between the third discharged liquid tank 28*c* and second ring 62, and between the second discharged liquid tank 28*b* and third ring 63, respectively. Further, the fourth discharged liquid tank 28*d* and first ring 61 have approximately the same shape (doughnut type). This is true for the third discharged liquid tank 28*c* and second ring 62, as well as the second discharged liquid tank 28*b* and third ring 63. It is therefore possible to efficiently discharge chemical solutions stored temporarily in the second to fourth discharged liquid tanks 28*b* to 28*d*.

Lastly, the first to third rings 61 to 63 are stacked vertically. This reduces the space of the storage unit 60, thereby reducing the floor space of the substrate processing apparatus 1.

2. Second Preferred Embodiment

The following is a second preferred embodiment of the present invention. This embodiment is different from the first preferred embodiment in the point that there is added hardware to discharge a rinsing liquid from the vicinity of the guide part 51*f*. This different point will fully be described hereinafter.

In the following description, like components are identified by the same reference numerals as in the components of the substrate processing apparatus of the first preferred embodiment. The descriptions of these components are omitted here because they have already been described above.

2-1. Configuration of Substrate Processing Apparatus

Figure 12:
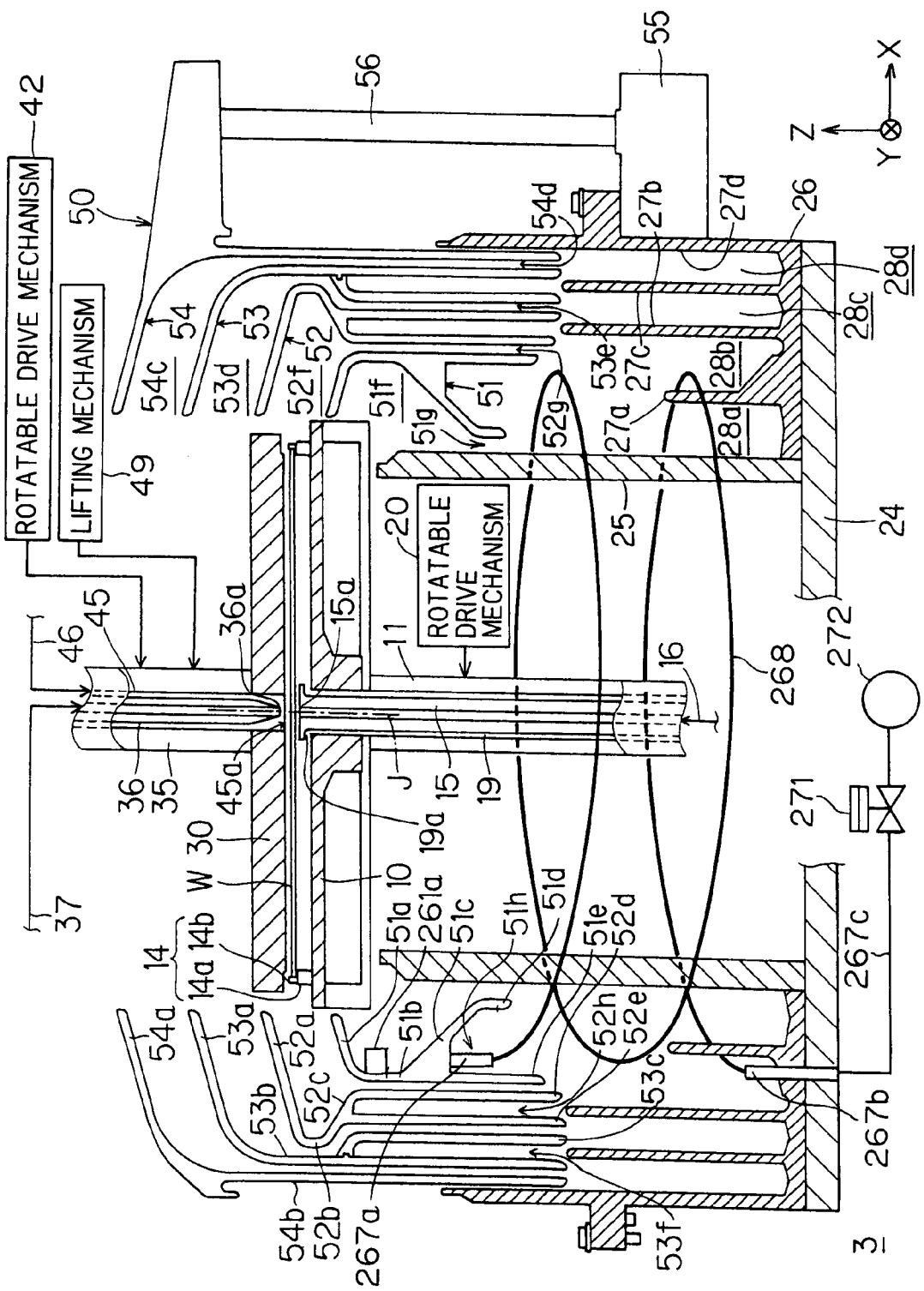
FIG. 12 is a longitudinal sectional view showing one example of the configuration of a substrate processing apparatus according to a second preferred embodiment of the present invention.

FIG. 12 is a vertical sectional view showing the configuration of a substrate processing apparatus 200 according to the second preferred embodiment. Like the substrate processing apparatus 1 of the first preferred embodiment, the substrate processing apparatus 200 is capable of performing processes such as bevel etching by supplying a chemical solution to the lower surface of a substrate W that is a semiconductor wafer.

Figure 13:
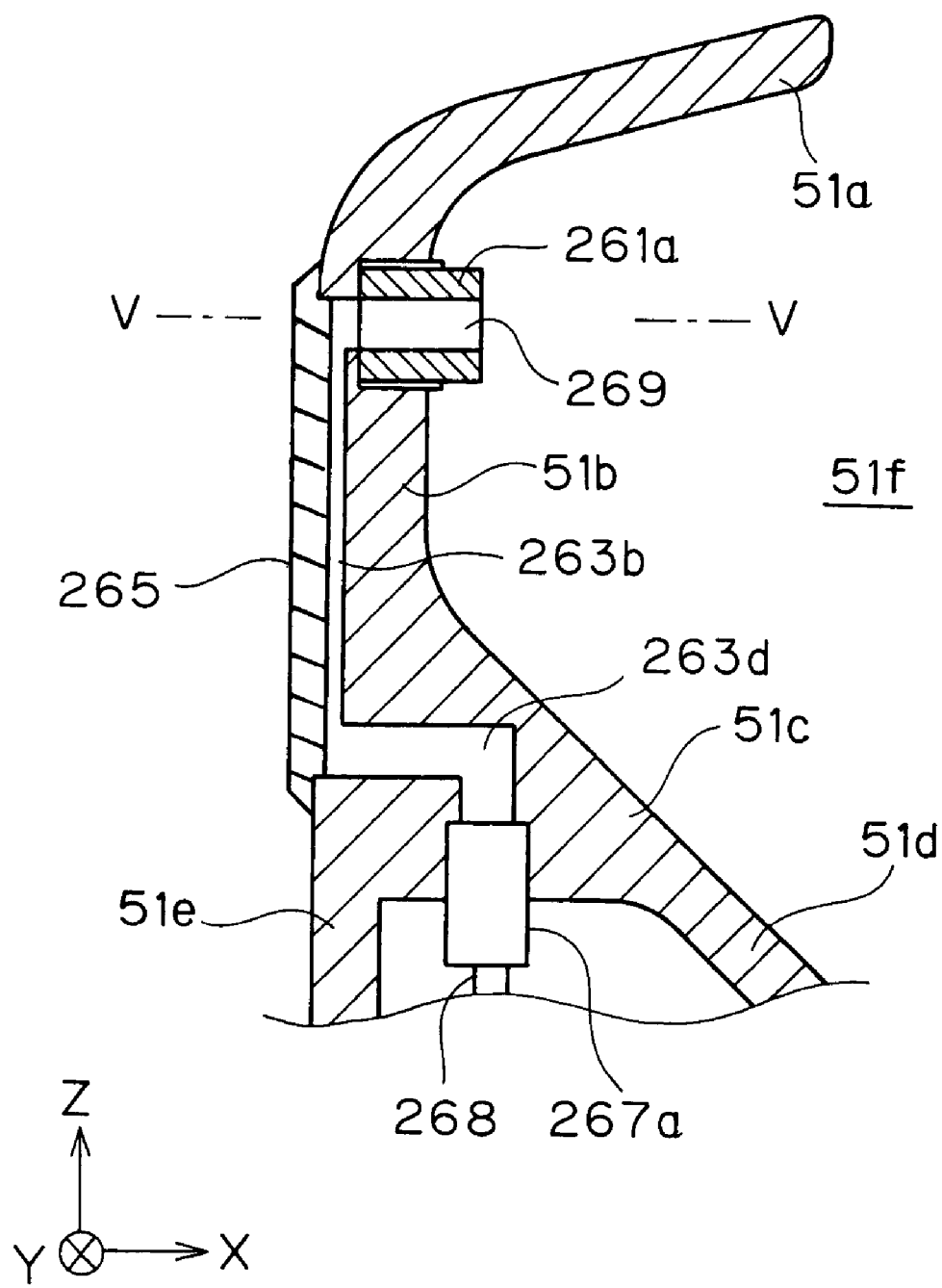
FIG. 13 is a sectional view showing one example of a rinsing liquid discharge part disposed in a guide part.
Figure 14:
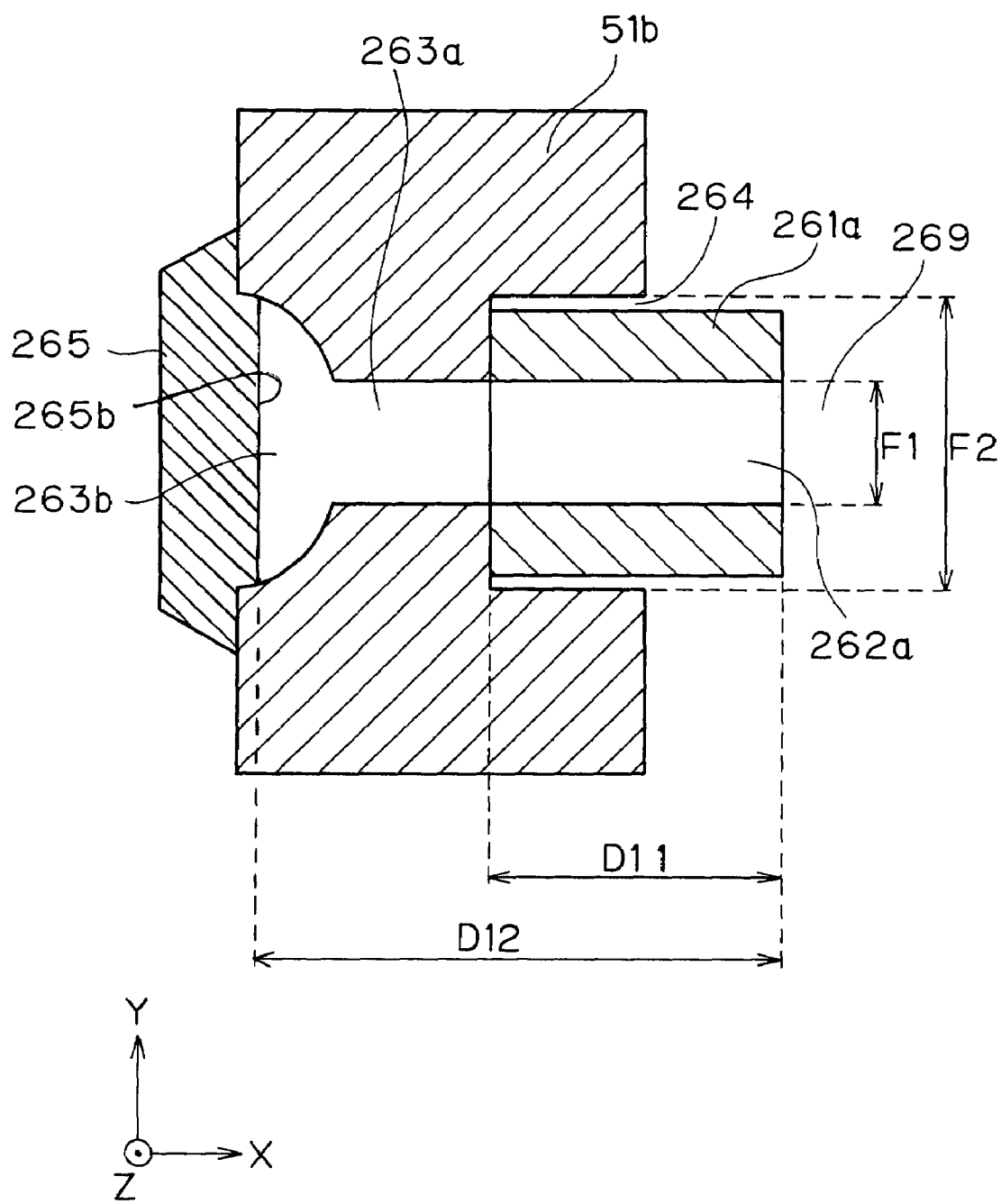
FIG. 14 is a diagram showing a cross section of the guide part of FIG. 13 as seen from line V-V.

A rinsing liquid discharge part 261a is provided on the inner peripheral surface of a cylindrical part 51b. FIG. 13 is a sectional view showing one example of the rinsing liquid discharge part 261a disposed in a guide part 51f. FIG. 14 is a diagram showing a cross section of the guide part 51f of FIG. 13, as seen from line V-V.

Referring to FIG. 14, a hole part 264 of diameter F2 extends from the inner peripheral surface of the cylindrical part 51b to its outer peripheral surface. A rinsing liquid passage 263a of diameter F1 extends from the outer peripheral surface of the cylindrical part 51b to its inner peripheral surface. The rinsing liquid passage 263a and hole part 264 are connected in communication. Accordingly, the rinsing liquid passage 263a and hole part 264 provide communication between the inner peripheral surface and outer peripheral surface of the cylindrical part 51b.

The discharge part 261a is a member that is mainly used to discharge a rinsing liquid for washing away a chemical solution attached to a spin base 10 and chuck pins 14. As shown in FIG. 14, the discharge part 261a is a cylindrical member that has at its center a through-hole 262a of diameter F1 and is substantially parallel to an X-axis, and it is buried in the hole part 264. The through-hole 262a of the discharge part 261a is connected in communication to a rinsing liquid passage 263a, so that the through-hole 262a of the discharge part 261a is connected in communication to the outer peripheral surface of the cylindrical part 51b.

Referring again to FIG. 14, on the outer peripheral surface of the cylindrical part 51b, a groove pat 263b is formed so as to include one end of the rinsing liquid passage 263a, so that the rinsing liquid passage 263a is connected in communication to the groove part 263b. Further, on the outer peripheral surface of the cylindrical part 51b, there is provided a cover 265 that sealingly covers the groove part 263b and the space on the outer peripheral surface side. On the plane opposed to the groove part 263b of the cover 265, as shown in FIGS. 13 and 14, there is formed a projected part 65a projecting on the side of the groove part 263b so as to make a substantially tight fit with an opening portion of the groove part 263b. The cover 265 is joined on the outer peripheral surface of the cylindrical part 51b such that it seals the groove part 263b from the space on the outer peripheral side of the cylindrical part 51b. Therefore, the groove part 263b is apart from the space on the outer peripheral surface side of the cylindrical part 51b and is connected in communication to the rinsing liquid passage 263a. Further, as shown in FIG. 13, in the inside of an inclined part 51c there is formed a passage 263d, one end of which is connected in communication to the groove part 263b and the other end is connected in communication to the rinsing liquid pipe 267a buried in the inclined part 51c.

Thus in the second preferred embodiment, the passage 263d, groove part 263b and rinsing liquid passage 263a are disposed in the vicinity of the upper part of a guard 51, namely, the discharge part 261a, cylindrical part 51b and inclined part 51c. The rinsing liquid pipe 267a is connected in communication to a through-hole 262a in the discharge part 261a, via the passage 263d, groove part 263b and rinsing liquid passage 263a. With this configuration, by supplying a rinsing liquid to the rinsing liquid pipe 267a, the rinsing liquid can be discharged from a discharge port 269 to a direction substantially parallel to the plus direction on an X-axis. That is, the guide part 51f functions as a nozzle for discharging a rinsing liquid. It is therefore unnecessary to dispose a pipe that supplies a rinsing liquid around the periphery of the guide part 51f. This simplifies the configuration of the splash guard 50.

In addition, the rinsing liquid passing though the groove part 263b, rinsing liquid passage 263a and through-hole 262 to the discharge port 269 can flow distance D12 substantially linearly. Therefore, the rinsing liquid discharged from the discharge port 269 can be discharged substantially linearly in the plus direction on the X-axis, without being diffused.

Disposed below the guide part 51f is a tube 268 by which the rinsing liquid pipe 267a and a rinsing liquid pipe 267b provided in a second discharged tank 28b are relayed and connected in communication. As shown in FIG. 12, the tube 268, one end of which is fixed by the rinsing liquid pipe 267a and the other end is fixed by the rinsing liquid pipe 267b, is arranged in such a helical fashion that it is would around axis J being the rotary axis of a spin base 10 and extends vertically in the space near the second discharged liquid tank 28b between partition members 27a and 27b.

The tube 268 is made of a flexibly deformable material. Thereby, when the distance between the rinsing liquid pipes 267a and 267b is changed by lifting and lowering of the splash guard 50 by a guard lifting mechanism 55, the height in a Z-axis direction of the spiral structure of the tube 268 is changeable in accordance with the change of the distance. Therefore, if the guard lifting mechanism 55 lifts and lowers the splash guard 50 to reduce the space near the discharged liquid tank 28b, the tube 268 itself flexes and stays in the space near the discharged liquid tank 28b. It is therefore unnecessary to consider the interference (impact) between the members 27a and 27b.

Furthermore, when the tube 268 is made of a material of high elastic modulus (e.g., fluoroethylene resin) and, as in the second preferred embodiment, it is arranged in helical fashion, the amount of deflection can be reduced than that when the splash guard 50 is lowered with the tube 268 relayed linearly between the rinsing liquid pipes 267a and 267b. Accordingly, even if a material of high elastic modulus is employed, by arranging that material in helical fashion, the height in the Z-axis direction of the helical structure of the tube 268 can be changed easily in accordance with the lifting and lowering of the splash guard 50.

In the second preferred embodiment, the discharged liquid tank 28b is used to recover the used chemical solution, as described above. For this, the tube 268 is resistant to chemical solution and made of such an organic material (e.g., fluoroethylene resin) that when part of the material of the tube 268 dissolves, it does not contaminate the stored chemical solution.

Referring to FIG. 12, the rinsing liquid pipe 267b is pipe buried in a hole part passing through the second discharged liquid tank 28b and base member 24. The rinsing liquid pipe 267b is connected in communication to the base member 24 and a rinsing liquid pipe 267c disposed in an external space 3 on the outside of the partition member 27d. Thus in the second preferred embodiment, without providing unnecessary through-holes in guards 52 to 54, the rinsing liquid pipe 267a can be connected in communication, through the tube 268 and rinsing liquid pipe 267b, to the rinsing liquid pipe 267c disposed in the external space 3. It is therefore unnecessary to consider the interference between the pipe and splash guard 50 due to the splash guard 50 lifting and lowering. This simplifies the pipe configuration.

In order to avoid that the chemical solution stored in the second discharged liquid tank 28b leaks into the outside of the base member 24 via the second discharged liquid tank 28b and a hole part passing though the base member 24, a sealing mechanism (not shown) is disposed in the vicinity of the hole part.

The rinsing liquid pipe 267c is connected in communication to a rinsing liquid supply source 272 via a valve 271.

With this configuration, the guard lifting mechanism 55 performs lifting and lowering such that a discharge port 269 of a discharge part 261a and chuck pins 14 disposed vertically on the spin base 10 have approximately the same height, and the valve 271 is then opened, so that the rinsing liquid supplied from the rinsing liquid supply source 272 is discharged from the discharge port 269 to the spin base 10 and chuck pins 14, through the rinsing liquid pipe 267c, rinsing liquid pipe 267b, tube 268, rinsing liquid pipe 267a, passage 263d disposed in the guide part 51f, groove part 263b, rinsing liquid passage 263a and through-hole 262a (see FIGS. 12, 13 and 14). Accordingly, the chemical solution attached to the chuck pins 14 and the upper surface of the spin base 10 can be washed away and removed reliably. As the result, it is avoidable that this chemical solution is dried and causes particles, resulting in poor substrates.

2-2. Procedure of Substrate Processing

The following is procedure in processing a substrate W in the substrate processing apparatus so configured. A basic procedure in this apparatus is similar to that of the first preferred embodiment. That is, after the substrate W is subjected to etching process with a chemical solution, there is performed a rinsing process of washing the chemical solution with pure water, followed by a spin dry process of shaking off droplets by spinning the substrate W. In the second preferred embodiment, a bevel etching of the peripheral part of the substrate W is to be performed by using the first chemical solution.

Figure 16:
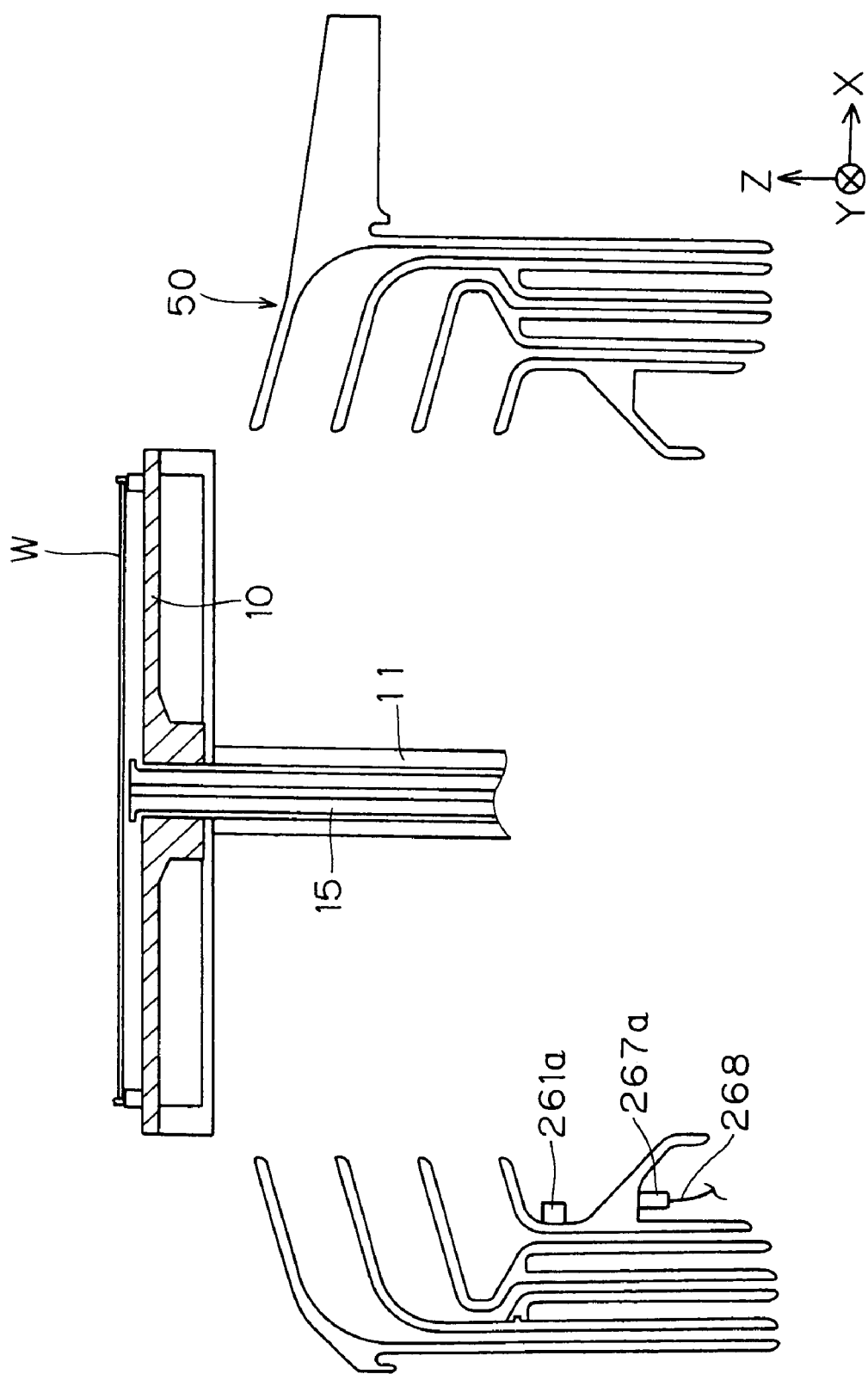
FIG. 16 is a diagram showing other example of the relationship between the splash guard and the height of the spin base.

First, the splash guard 50 is lowered so that the spin base 10 projects beyond the splash guard 50 (see FIG. 16), and the atmosphere blocking plate 30 is considerably lifted so as to be far apart from the spin base 10. In this state, a transport robot (not shown) gives an untreated substrate W to the spin base 10. Then, the chuck pins 14 grip the peripheral part of the given substrate W to thereby hold the substrate W in its horizontal position.

Subsequently, the splash guard 50 is lifted so that it is positioned around the spin base 10 and the periphery of the substrate W held by the spin base 10, and the atmosphere blocking plate 30 is lowered so that it is brought near the substrate W. Note that the atmosphere blocking plate 30 is not in contact with the substrate W. At this time, the control part 99 controls the guard lifting mechanism 55 to adjust the physical relationship between the substrate W held by the spin base 10 and the splash guard 50, namely, to control the height position of the splash guard 50, such that the processing liquid flying spattering from the substrate W that is rotated during the etching process is received by a guide part corresponding to the type of recovery of the processing liquid. Since the type of recovery in this embodiment is to recover the first chemical solution for its reuse, the corresponding guide part is the recovery port 52f and the guard lifting mechanism 55 lifts the splash guard 50 such that the recovery port 52f is positioned around the spin base 10 and the periphery of the substrate W held by the spin base 10 (see FIG. 12).

Subsequently, the spin base 10 and the substrate W held by the spin base 10 are rotated. The atmosphere blocking plate 30 is also rotated. In this state, a chemical solution is discharged from the processing liquid lower nozzle 15 only to the lower surface of the substrate W. The chemical solution discharged from the processing liquid lower nozzle 15 spreads over the lower surface of the substrate W by centrifugal force. Part of this chemical solution reaches the peripheral part of the upper surface of the substrate W to thereby execute an etching process (bevel etching) of the peripheral part of the upper surface of the substrate W.

The first chemical solution flying spattering from the substrate W in rotation during the etching process is received by the recovery port 52f and introduced from the recovery port 52f to the second passage 52g. Then, along the second passage 52g, it flows down to the second discharged liquid tank 28b and is stored there temporarily. Thereafter, as in the first preferred embodiment, it is stored in the third ring 63 disposed apart from the spin base 10.

Figure 15:
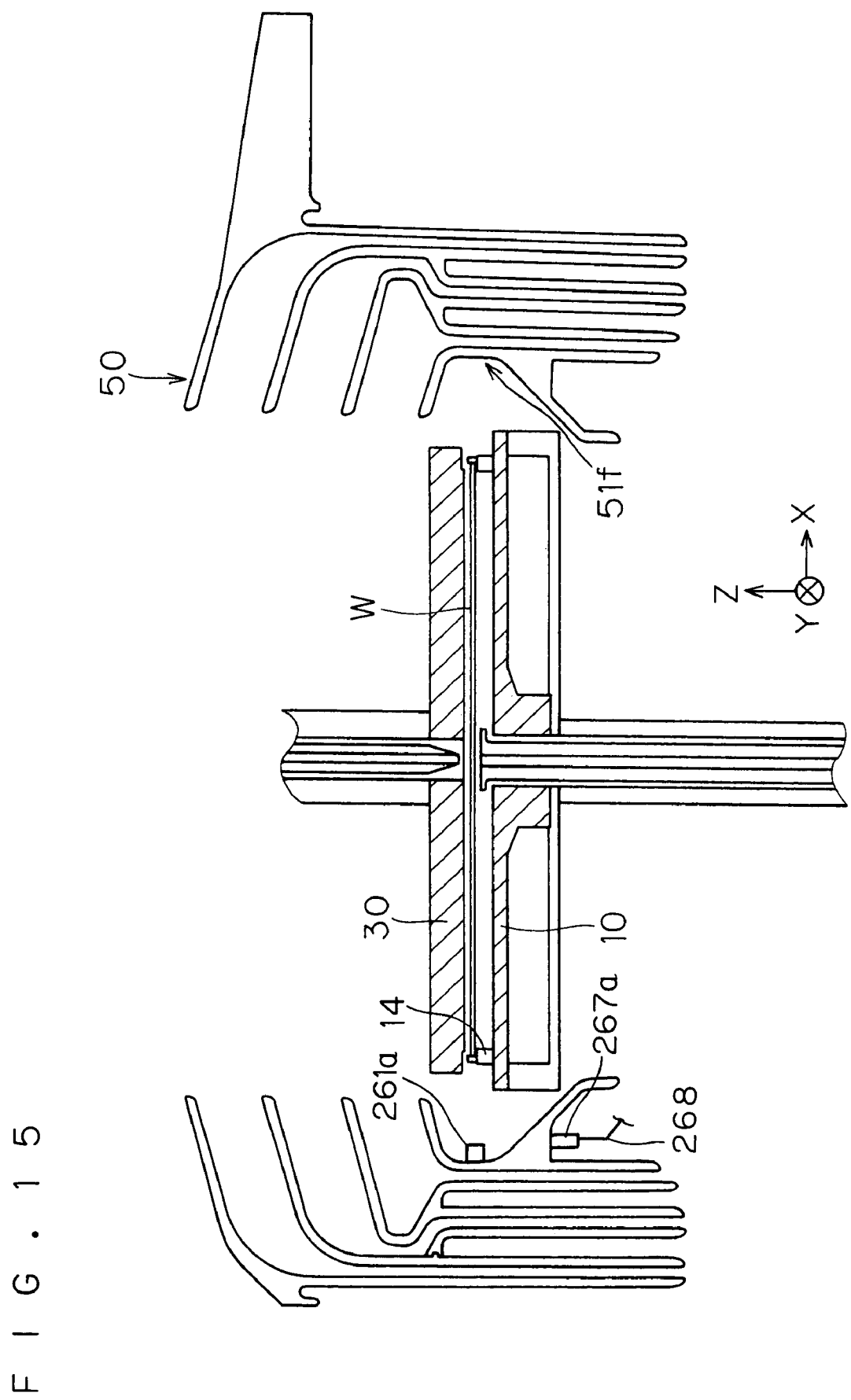
FIG. 15 is a diagram showing one example of the relationship between a splash guard and the height of a spin base.

After the etching process for a predetermined period of time is completed, the chemical solution discharge from the processing liquid lower nozzle 15 is stopped and the splash guard 50 is slightly lifted such that the discharge port 261a disposed on the inner peripheral surface of the cylindrical part 51b has approximately the same height as the chuck pins 14 vertically disposed in the spin base 10 (see FIG. 15). The atmosphere blocking plate 30 is maintained at a slightly higher position than in the etching process. In this state, the valve 38d and valve 12d (see FIG. 3) are opened while rotating the substrate W, so that a rinsing liquid is discharged to the upper and lower surfaces of the substrate W from the processing liquid upper nozzle 36 and processing liquid lower nozzle 15. The discharged pure water extends to the entire surfaces of the upper and lower surfaces of the substrate W by centrifugal force, thereby executing a cleaning process (rinsing process) to wash away the chemical solution by the rinsing liquid.

By opening the valve 38d and valve 12d and opening and valve 271 at the same time, the rinsing liquid is discharged from the discharge part 261a to the spin base 10. The discharged rinsing liquid reaches the plane opposed to the lower surface of the substrate W on the spin base 10 and the chuck pins 14, so that the attached chemical solution is washed. This avoids that the attached chemical solution is dried and causes particles, thus avoiding poor processing of the substrate W.

In this preferred embodiment, pure water is used as a rinsing liquid. In an alternative, a small amount of nitrogen gas may be discharged from the gas supply path 19 and gas supply path 45 during the rinsing process, in order to avoid the back flow of the rinsing liquid to the gas supply paths 19 and 45.

The rinsing liquid flying spattering from the substrate W in rotation during the rinsing process is received by the guide part 51f of the splash guard 50 and introduced from the recovery port 51f to the first passage 51g. Then, along the first passage 51g, it flows down to the first discharged liquid tank 28a and is stored there temporarily. Thereafter, as in the first preferred embodiment, it is discarded to the discharged liquid drain 88 disposed apart from the spin base 10.

After the rinsing process for a predetermined period of time is completed, the pure water discharge from the processing liquid upper nozzle 36, and processing liquid lower nozzle 15 and discharge port 261a is stopped and the splash guard 50 is lowered such that the spin base 10 slightly projects beyond the splash guard 50. The atmosphere blocking plate 30 is maintained near the substrate W. In this state, through the gas supply path 19 and gas supply path 45, nitrogen gas is discharged and sprayed to the upper and lower surfaces of the substrate W, while rotating the substrate W. The discharged nitrogen gas passes through the space between the spin base 10 and the substrate W, and the space between the atmosphere blocking plate 30 and the substrate W, so that the surroundings of the substrate W is made into an atmosphere of low oxygen concentration. Under the atmosphere of low oxygen concentration with the supplied nitrogen gas, the droplets attached to the substrate W are shaken off by the centrifugal force developed by the rotation, thereby executing shake dry process (spin dry process).

After the spin dry process for a predetermined period of time is completed, the rotations of the spin base 10 and the substrate W held by the spin base 10 are stopped. The rotation of the atmosphere blocking plate 30 is also stopped and the atmosphere blocking plate 30 is lifted so as to be apart from the spin base 10. In this state, a transport robot (not shown) takes and unloads the treated substrate W out of the spin base 10, thereby completing a sequence of substrate processes.

2-3. Advantages of Substrate Processing Apparatus

Firstly, in the substrate processing apparatus 200 of the second preferred embodiment, the rinsing liquid is dischargeable from the discharge port 269 to the spin base 10 by adjusting the discharge port 269 and chuck pins 14 to approximately the same height by the guard lifting mechanism 55, and then opening the valve 271. It is therefore possible to wash and remove the chemical solution attached to the spin base 10 and the chuck pins 14. This prevents that this chemical solution is dried and causes particles, thereby avoiding poor substrates.

Secondly, the guide part 51*f* is provided with the passages for rinsing liquid (the passage 263*d*, groove 263*b* and rinsing liquid passage 263*a*). The discharge part 261*a* connected in communication to these passages is buried in the inner peripheral surface of the cylindrical part 51*b*. It is therefore possible to discharge the rinsing liquid from the discharge port 269 of the discharge part 261*a* to the spin base 10, without disposing any pipe to supply the rinsing liquid around the periphery of the guide part 51*f*. This allows the guide part 51*f* to function as a nozzle for discharging the rinsing liquid.

Thirdly, the rinsing liquid supplied from the rinsing liquid supply source 272 flow substantially linearly through the groove part 263*b* to the rinsing liquid passage 263*a* and through hole 262*a*, and then reaches the vicinity of the discharge port 269. Therefore, the rinsing liquid discharged from the discharge port 269 can be discharged substantially linearly in a direction substantially parallel to the X-axis, without being diffused.

Fourthly, the rinsing liquid pipe 267*a* is connected in communication to the rinsing liquid pipe 267*c* through the tube 268 and rinsing liquid pipe 267*b*, and the tube 268 is disposed in the space near the discharged liquid tank 28*b*. Therefore, the rinsing liquid pipe 267*a* can be connected in communication to the rinsing liquid supply source 272 disposed in the external space 3, without providing any unnecessary throughholes in the guards 52 to 54. It is also unnecessary to consider the interference (impact) between the tube 268 and splash guard 50 due to the splash guard 50 lifting and lowering. This simplifies the pipe configuration.

Lastly, when the tube 268 is made of a material of high elastic modulus and, as in the second preferred embodiment, by arranging it in helical fashion, the amount of deflection can be reduced than that when the splash guard 50 is lowered with the tube 268 relayed linearly between the rinsing liquid pipes 267*a* and 267*b*. Accordingly, even for a material of high elastic modulus, by arranging that material in helical fashion, the height in the Z-axis direction of the helical structure of the tube 268 can be changed easily in accordance with the lifting and lowering of the splash guard 50.

3. Third Preferred Embodiment

The following is a third preferred embodiment of the present invention. A substrate processing apparatus 300 of this embodiment is substantially similar to that of the second preferred embodiment, except that hardware configuration for discharging a rinsing liquid (cleaning liquid for check) from the vicinity of a guide part 51*f*. This different point will be fully described hereinafter.

In the following description, like components are identified by the same reference numerals as in the components of the substrate processing apparatus of the second preferred embodiment. The descriptions of these components are omitted here because they have already been described in the first and second preferred embodiment.

3-1. Configuration of Substrate Processing Apparatus

Figure 18:
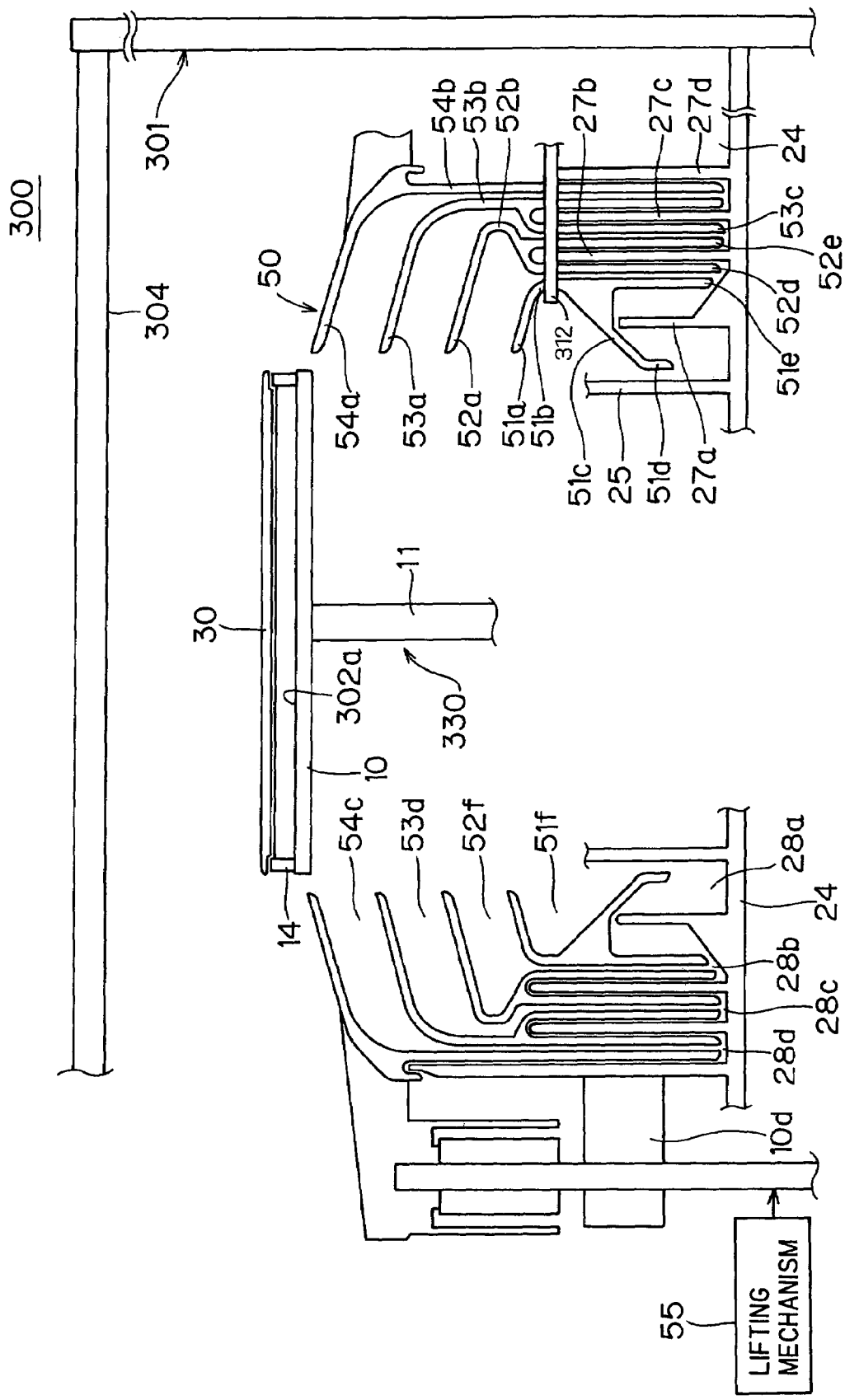
FIG. 18 is a schematic sectional view of the entire configuration of a substrate processing apparatus according to a third preferred embodiment of the present invention.
Figure 19:
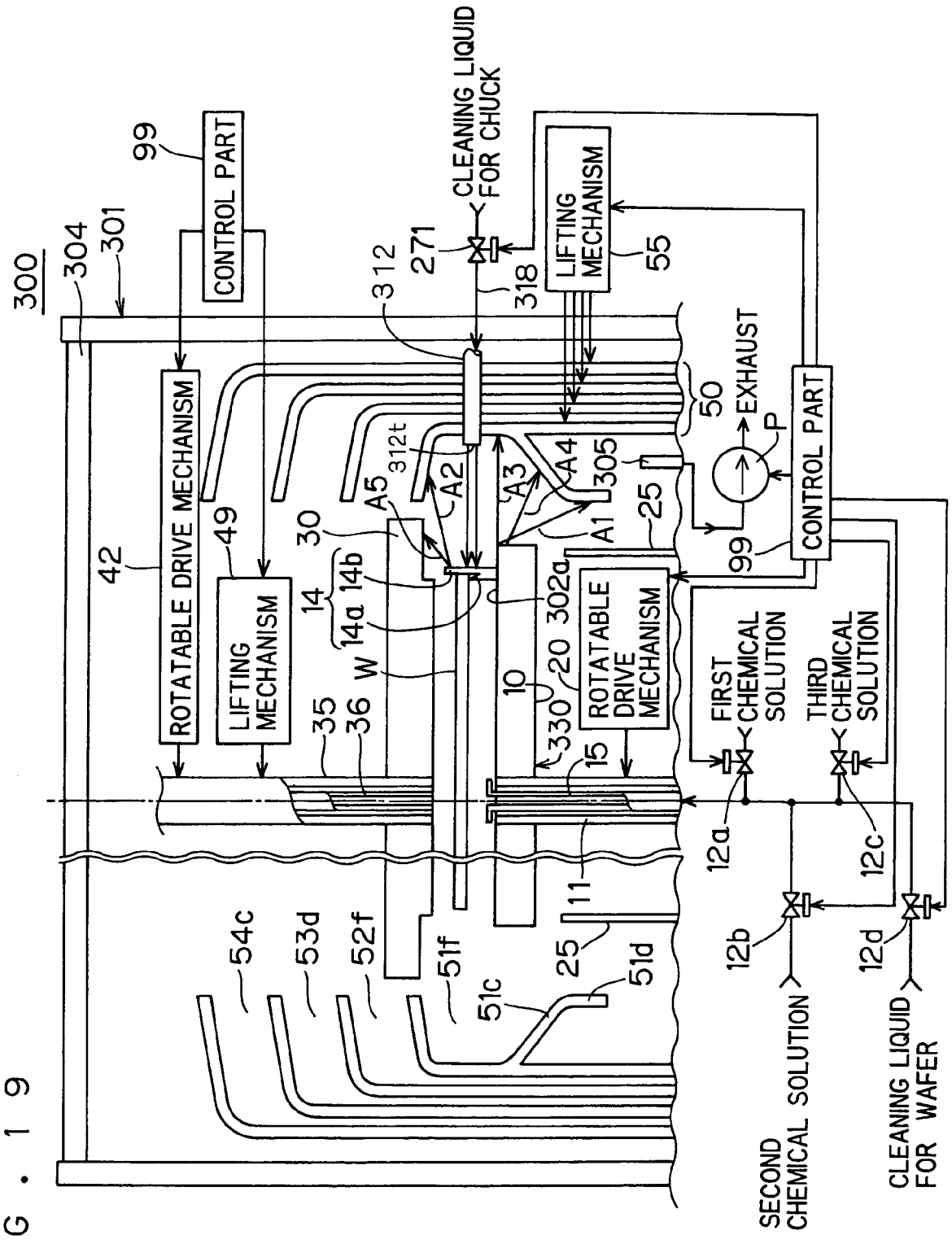
FIG. 19 is a schematic sectional view to explain the configuration and control of the substrate processing apparatus of FIG. 18.

FIG. 18 is a schematically sectional view of the entire configuration of the substrate processing apparatus 300 of the third preferred embodiment. FIG. 19 is a schematic sectional view to explain the structure and control of the substrate processing apparatus 300 in FIG. 18. The apparatus 300 performs processing by supplying a chemical solution to the lower surface of a semiconductor wafer W (hereinafter referred to simply as a "wafer"), which is one example of semiconductor substrates.

The substrate processing apparatus 300 includes a cylindrical chamber 301 having a central axis extending along a substantially vertical direction, a spin chuck 330 that holds substantially horizontally a wafer W disposed in the chamber 301 and rotates about a vertical axis passing through approximately the center of the wafer W, and splash guard 50 disposed so as to circumscribe the spin chuck 330 in a horizontal plane.

Referring to FIGS. 18 and 19, a filter 304 is attached so as to cover the upper end of the chamber 301. There is disposed a discharged liquid and gas pipe 305 passing through a lower part of the chamber 301. The pipe 305 is connected to a pump P for exhaust on the outside of the chamber 301 via a gas and liquid separation part (not shown). By operating the pump P, foreign matter of the air in the outside the chamber 301 is removed by the filter 304, and the air is introduced into the chamber 301 and discharged from the pump P to the outside of the chamber 301.

Referring again to FIGS. 18 and 19, a cleaning nozzle 312 passing through the splash guard 50 is attached substantially horizontally. The cleaning nozzle 312 passes through a cylindrical member 51*b* and projects in a guide part 51*f*. A discharge port 312*t* is formed at the top of the cleaning nozzle 312. The discharge port 312*t* may be of circular section, for example. In this case, the diameter of the discharge port 312*t* is preferably not more than 8 mm.

The discharge port 312*t* is located at a position slightly projecting beyond the internal wall of the guide part 51*f* (cylindrical member 51*b*) and arranged in the inside of the guide part 51*f* (preferably, at a deeper position). From this position to inwardly in the turning radius direction of the spin chuck 330, the cleaning liquid for chuck is discharged substantially horizontally. This arrangement of the discharge port 312*t* avoids that the top of the cleaning nozzle 312 interferes with other member such as the spin base 10.

The cleaning nozzle 312 is connected via a cleaning liquid pipe 318 to a cleaning liquid supply source for chuck that contains a cleaning liquid for chuck, such as pure water. If a cleaning liquid for wafer and a cleaning liquid for chuck are of the same type (e.g., pure water), a single supply source may be used as the supply source of cleaning liquid for wafer and that of cleaning liquid for chuck.

A valve 271 is interposed in the cleaning liquid pipe 318. By opening the valve 271, the cleaning liquid for chuck can be discharged in a bar-like from the cleaning nozzle 312 to the chuck pins 14 and an upper surface 302a of the spin base 10.

Like other valves, the valve 271 is connected to a control part 99, and the opening and closing of the valve can be controlled at a predetermined timing.

3-2. Procedure of Substrate Processing

The following is the procedure of processing a wafer W in the third preferred embodiment. When processing the wafer W in the substrate processing apparatus 300, first, the control part 99 controls to bring all valves 12a to 12c into their closed state. The control part 99 also controls a lifting mechanism 49 such that a blocking plate 30 is close to above the wafer W held by a spin chuck 330 and also positioned so as to oppose to the wafer W. Subsequently, the control part 99 controls a rotatable drive mechanisms 20 and 42 so as to rotate the wafer W held by the spin chuck 330 and the blocking plate 30.

Thereafter, the control part 99 controls a lifting mechanism 55 to move the splash guard 50 such that the upper surface 302a of the spin base 10 and a recovery port 54c are positioned at approximately the same height.

In this state, under the control of the control part 99, a valve 12a is opened and a first chemical solution is discharged from a lower nozzle 15. By the centrifugal force of the wafer W, the first chemical solution flows outwardly along the lower surface of the wafer W to thereby process the lower surface of the wafer W. When the first chemical solution is etching liquid, this process may be so-called bevel etching or bevel cleaning, in which etching or cleaning is performed by allowing the first chemical solution to reach the peripheral edge of the upper surface of the wafer W.

The first chemical solution that has reached the outer peripheral part of the wafer W is shaken sidewardly by the centrifugal force of the water W, and then recovered by a recovery port 54c. After the process of the wafer W is continued for a certain period of time, the valve 12a is closed to stop the discharge of the first chemical solution under the control of the control part 99.

Depending on the type of a wafer W to be processed, a second chemical solution instead of the first chemical solution is used to process the lower surface of the wafer W. In this case, first, the control part 99 controls the lifting mechanism 55 to move the splash guard 50 such that the upper surface 302a of the spin base 10 and recovery port 53d are positioned at approximately the same height. In this state, a valve 12b is opened and the second chemical solution is discharged from the lower nozzle 15 under the control of the control part 99. The second chemical solution flows downwardly along the lower surface of the wafer W. Thereby, the lower surface of the wafer W is processed with the second chemical solution. This process may also be bevel etching or bevel cleaning.

The second chemical solution shaken sidewardly by the centrifugal force of the wafer W in rotation is recovered in the recovery port 53d. After such an operation is continued for a certain period of time, the valve 12b is closed under the control of the control part 99.

Further, depending on the type of a wafer W to be processed, the lower surface of the wafer W is processed with a third chemical solution instead of the first or second chemical solution. In this case, first, the control part 99 controls the lifting mechanism 55 to move the splash guard 50 such that the upper surface 302a of the spin base 10 and recovery port 52f are positioned at approximately the same height.

In this state, under the control of the control part 99, a valve 12c is opened and the third chemical solution is discharged from the lower nozzle 15. The third chemical solution flows downwardly along the lower surface of the wafer W. Thereby, the lower surface of the wafer W is processed with the third chemical solution. This process may also be bevel etching or bevel cleaning.

The third chemical solution shaken sidewardly by the centrifugal force of the wafer W in rotation is recovered in the recovery port 52f. After such an operation is continued for a certain period of time, the valve 12c is closed under the control of the control part 99.

When the wafer W is processed with the first, second or third chemical solution, part of the first, second or third chemical solution drops down on the upper surface 302a of the spin base 10. At the completion of the process with the first, second or third chemical solution, the upper surface 302a of the spin base 10 and chuck pins 14 are stained with the first, second or third chemical solution.

Thereafter, the control part 99 controls the lifting mechanism 55 to move the splash guard 50 such that the upper surface 302a of the spin base 10 and the guide part 51 fare located at approximately the same height. In this state, the blocking plate 30 and the top of the projected part 51a (the upper end of the guide part 51f) are positioned at approximately the same height and closed to each other. The rotations of the wafer W and blocking plate 30 by the rotatable drive mechanism 20 and 42 are maintained.

Subsequently, under the control of the control part 99, a valve 12d is opened and the cleaning liquid for wafer is discharged from the lower nozzle 15. Likewise, the cleaning liquid for wafer is also discharged from an upper nozzle 36. The cleaning liquid for wafer flows downward along the upper and lower surfaces of the wafer W by the centrifugal force of the wafer W. Thereby, the upper and lower surfaces of the wafer W are cleaned. The cleaning liquid for wafer is then received (trapped) by the guide part 51f of the splash guard 50 and it further flows downward and is recovered in the first discharged liquid tank 28a.

Subsequently, the control part 99 controls the rotatable drive mechanism 20 and 42 so as to reduce the number of revolutions of the spin chuck 330 and blocking plate 30. As the result, no sufficiently large centrifugal force of the wafer W is applied to the cleaning liquid for wafer discharged from the lower nozzle 15. Therefore, the cleaning liquid for wafer drops down to the lower nozzle 15 and cleans it.

Low-speed rotation of the spin chuck 330 does not render large centrifugal force to the upper surface 302a of the spin base 10 and the cleaning liquid for wafer flowing on the upper surface of the wafer W. The cleaning liquid for wafer to be shaken off from the spin base 10 and wafer W fails to fly sidewardly at sufficiently high speed and, as shown by arrow A1 in FIG. 2, drops downwardly without reaching the guide part 51f. However, the recovery ports 54c, 53d and 52f are not positioned at a location lower than the guide part 51f. That is, since the guide part 51f is positioned at a location lower than the lowermost-stage recovery port 52f, there is no possibility that the cleaning liquid for wafer enters the first, second or third chemical solution.

Through the foregoing processes, the chuck pins 14 and the upper surface 302a of the spin base 10 are almost cleaned with the cleaning liquid for wafer. On the other hand, the opposite part of the chuck pins 14 and the upper surface 302a in the vicinity of the opposite part, when viewed from the center of the upper surface 302a, are not cleaned sufficiently and the first, second or third chemical solution remains there.

If the first, second or third chemical solution left on the chuck pins 14 and the upper surface of the spin base 10 is dried, its chemical component is crystallized and made into particles, which causes contamination. Therefore, it is necessary to clean the area where the first, second or third chemical solution remains in the chuck pins 14 and the upper surface 302a of the spin base 10.

First, the control part 99 controls the rotatable drive mechanism 20 and 42 such that the number of revolutions of the wafer W and blocking plate 30 are returned to that in cleaning the wafer W. Then, under the control of the control part 99, a valve 271 is opened and the cleaning liquid for chuck is discharged from a cleaning nozzle 312. The quantity of flow of the cleaning liquid for chuck discharged from the cleaning nozzle 312 is preferably not more than 3 liters/min.

The rotations of the spin base 10 and blocking plate 30 by the rotatable drive mechanism 20 and 42, as well as the discharge of the cleaning liquid for wafer from the lower nozzle 15 and upper nozzle 36 are continued. Even if only one cleaning nozzle 312 is provided, the rotation of the spin base 10 enables to apply the cleaning liquid for chuck to all the chuck pins 14 and the upper surface 302a in the vicinity of the pins 14, so that the area where the first, second or third chemical solution remains in the chuck pins 14 and the upper surface 302a of the spin base 10.

In this time, the cleaning liquid for chuck, which is shaken sideward from the spin base 10 and, alternatively, strikes the chuck pins 14 and bounds to the cleaning nozzle 312, is trapped (as indicated by arrows A2, A3 and A4 in FIG. 19) in the vicinity of the cleaning nozzle 312 in the guide part 51f. Then, it runs down and is recovered in the first discharged liquid tank 28a. Likewise, the cleaning liquid for chuck that bounds from the chuck pins 14, and flies spatters upward in the state of mist is also trapped by the lower surface of the blocking plate 30 (as indicated by arrow A5 in FIG. 19). Then, it is shaken sidewardly so as to be recovered in the first discharged liquid tank 28a. Since the diameter of the blocking plate 30 is greater than that of the wafer W, the cleaning liquid for chuck flying spattering obliquely upward from the chuck pins 14 can be trapped efficiently. Thus, the substrate processing apparatus 300 is so configured as to separately recover the first, second and third liquids and cleaning liquids (the cleaning liquid for wafer and the cleaning liquid for chuck). The presence of the splash guard for trapping the cleaning liquid for chuck permits a simple structure of the apparatus 300.

Further, since the recovery ports 54c, 53d and 52f are not disposed at a location lower than the guide part 51f, little or no cleaning liquid for chuck enters the recovery ports 54c, 53d and 52f. Accordingly, since no cleaning liquid for chuck enters the first, second and third chemical solutions recovered in the four, third and second discharged liquid tanks 28d, 28c and 28b, respectively, it is avoidable the event that the concentration of active ingredients in the first, second and third chemical solutions is thinned. That is, in accordance with the substrate processing apparatus 300, increasing the reusable number of the first, second and third chemical solutions reduces the quantity consumed of these chemical solutions.

Furthermore, there is little or no possibility that the cleaning liquid for chuck, in which the first, second or third chemical solution is dissolved, attaches to the parts such as the internal wall of the chamber 301 and the lower surface of the filter 304, and it is then dried to generate the crystal of the chemical solution component. This permits to reduce the amount of contamination accumulated.

Thereafter, the control part 99 controls the lifting mechanism 55, so that the splash guard 50 is lowered and the upper surface of the splash guard 50 is positioned at a location lower than the upper surface 302a of the spin base 10. In this state, the control part 99 controls the rotatable drive mechanism 20 and 42 such that the wafer W held by the spin chuck 330 and the blocking plate 30 are shaken and dried by high-speed rotation for a certain period of time. The cleaning liquid for wafer and the cleaning liquid for chuck, which are shaken sideward by the centrifugal forces of the wafer W in rotation and the spin base 10, strike the internal wall of the chamber 301 and runs down through the space between the chamber 301 and splash guard 50, and then is recovered in a cleaning liquid recovery tank 324.

Since the mist of the cleaning liquid for wafer and the mist of the cleaning liquid for chuck that take place when cleaning the wafer W, upper surface 302a and chuck pins 14 are blocked by the blocking plate 30, they hardly stay above the blocking plate 30. These mists are mainly present in the inside of the splash guard 50. Thus, drying at a location higher than the upper end of the splash guard 50 eliminates the possibility that the mist of the cleaning liquid for wafer and the mist of the cleaning liquid for chuck attach on the wafer W. Accordingly, even when the cleaning liquid for wafer and the cleaning liquid for chuck are dried on the wafer W, no particles occur due to the crystallization of their chemical solution components.

4. Modifications

While the present invention has been shown in the foregoing preferred embodiments, it is to be understood that it is not limited the examples described above. For example, the following modifications (1) through (7) can be considered.

(1) Although in the first preferred embodiment the splash guard 50 has a four-stage structure consisting of the four guards 51, 52, 53 and 54, without limiting to this, it may have a structure consisting of three or more stages. In this case, it is necessary that multistage chemical guide parts for receiving chemical solution are stacked on the pure water guide part for receiving pure water. In the multistage chemical guide parts, not only the lowermost chemical guide part but also the overlying chemical solution guide parts may be configured like the recovery port 52f. For example, in the foregoing preferred embodiments, the guard 53 may be curved such that the recovery port 53d is similar to the recovery port 52f.

(2) Although the first preferred embodiment is directed to the substrate processing apparatus that performs bevel etching to semiconductor wafers, the present invention is also applicable to an apparatus that performs processing other than etching, such as cleaning of the upper and lower surfaces of semiconductor wafers. Further, it is applicable to an apparatus that performs processing to a variety of substrates other than semiconductor wafer, such as glass substrates for crystal liquid display, glass substrates for photomask and substrates for optical disk.

(3) Although in the first preferred embodiment only the third ring 63 is used to execute processing, without limiting to this, the first ring 61 or second ring 62 may be used depending on the number of chemical solutions used.

(4) Although in the first preferred embodiment only the processing liquid temporarily recovered in the second to fourth discharged tanks 28b, 28c and 28d is recovered and reused, whereas the processing liquid temporarily stored in the first discharged liquid tank 28a is discarded. Without limiting to this, a storage part corresponding to the first discharged liquid tank 28a may be provided to obtain hardware configuration capable of recovering the used processing liquid.

Figure 17:
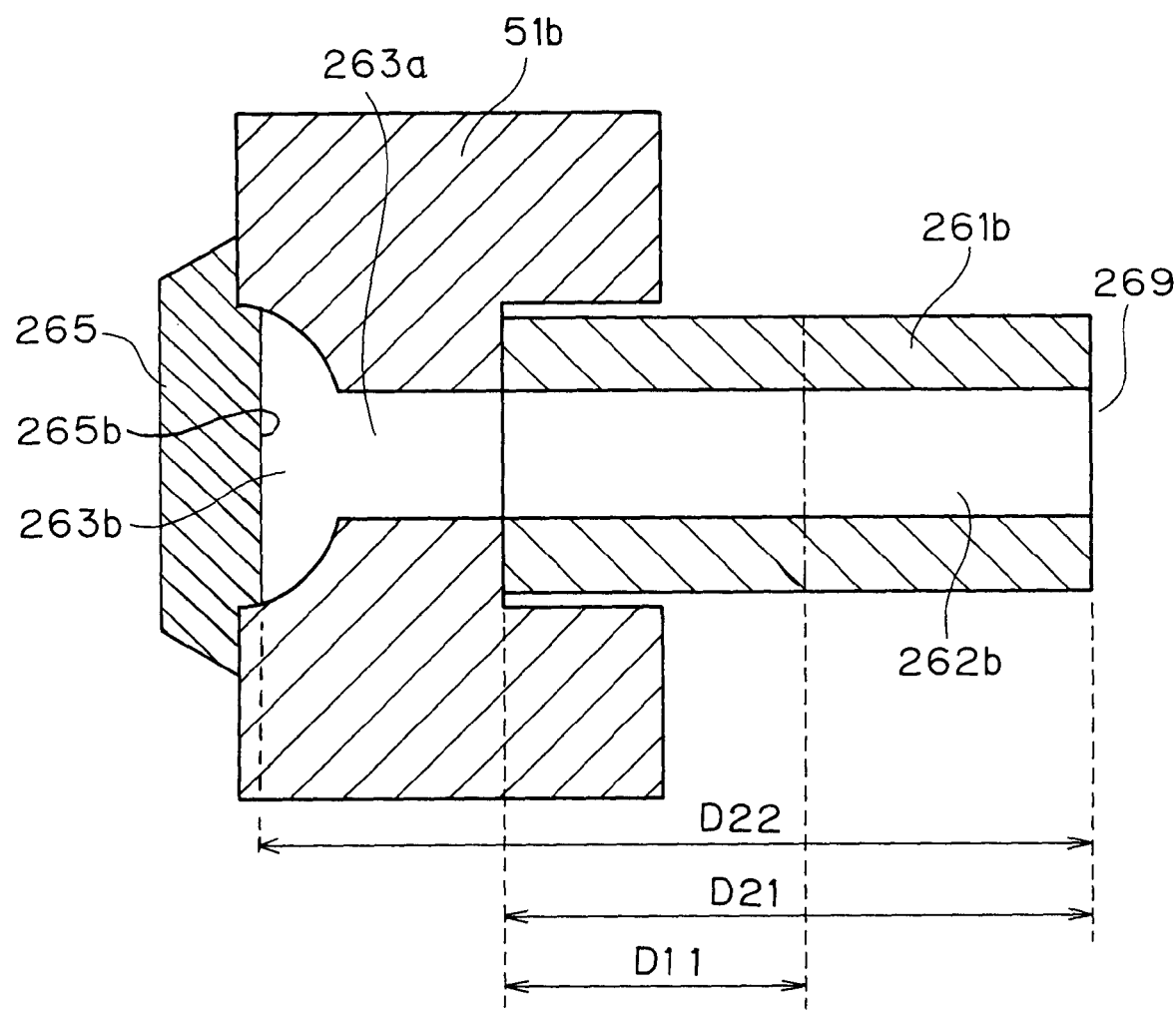
FIG. 17 is a diagram showing other cross section of the guide part of FIG. 13 as seen from line V-V.

(5) Although in the second preferred embodiment the length in the X-axis direction of the discharge part 261a is set to D11 (see FIG. 14), the X-axis direction may be set to D21 by using the discharge part 261b in place of the discharge part 261a, as shown in FIG. 17. As the result, as shown in FIG. 17, the rinsing liquid passage extending through the groove part 263b, rinsing liquid passage 263a and rinsing liquid passage 262b to the discharge port 269 has distance D22, which is longer than the case of using the discharge part 261a (distance D12). It is therefore possible to improve the linearity of the rinsing liquid discharged from the discharge port 269.

(6) Although in the second preferred embodiment the tube 268 is arranged spirally in the space near the discharged liquid tank 28b, without limiting to this, the rinsing liquid pipe 267a and rinsing liquid pipe 267b may be relayed linearly, for example.

(7) Although in the second preferred embodiment the splash guard 50 is disposed such that it can be lifted and lowered by the guard lifting mechanism 55, without limiting to this, it may be so configured that the splash guard 50 is fixed and the base member 24 in which the rinsing liquid pipe 267b is buried, and the spin base 10 can be integrally lifted and lowered. Also in this case, since the tube 268 is flexible as the splash guard 50 is relatively lifted or lowered with respect to the spin base 10, the tube 268 functions as a relay pipe that relays the rinsing liquid pipes 267a and 267b. It is therefore possible to discharge the rinsing liquid from the discharge port 269 even when the base member 24 and spin base 10 are lifted or lowered.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus comprising:
(a) a substrate holding part to hold a substrate in its substantially horizontal position;
(b) a rotary part to rotate a substrate held by said substrate holding part in a substantially horizontal plane;
(c) a processing liquid supply part to selectively supply a plurality of types of processing liquids to a substrate held by said substrate holding part;
(d) a plurality of guide parts of substantially annulus ring shape that receives a processing liquid flying spattering from a substrate in rotation, on the side of a substrate held by said substrate holding part;
each guide part comprising:
(d-1) a first processing liquid guide part to receive pure water flying spattering from a substrate in rotation; and
(d-2) a plurality of second processing liquid guide parts that are stacked in multistage on said first processing liquid guide part and receive a second processing liquid flying spattering from a substrate in rotation;
(e) a plurality of processing liquid passages of substantially annulus ring shape that are provided to said plurality of guide parts in one-to-one correspondence and feed downwardly a processing liquid introduced from their corresponding guide parts; and
(f) a position adjusting part to adjust the physical relationship between said substrate held by said substrate holding part and each of said guide parts, such that a processing liquid flying spattering from a substrate in rotation is received by a guide part corresponding to the recovery type of the processing liquid;
(g) a plurality of first recovery tanks of doughnut-like shape corresponding to said second processing liquid guide parts so as to recover, through said processing liquid passages, a second processing liquid flying spattering from said substrate by rotation;
(h) a plurality of storage parts that are located separately below said plurality of first recovery tanks so as to correspond to said plurality of first recovery tanks, respectively, each storage part including:
(h-1) a storage tank having a doughnut-like shape that is approximately the same as internal space shape of the corresponding said first recovery tank; and
(h-2) a plurality of pipes to connect in communication at a plurality of locations between the bottom of said corresponding said first recovery tank and the inside of said storage tank;
(i) a second recovery tank corresponding to said first processing liquid guide part so as to recover, through a processing liquid passage, said pure water flying spattering from said substrate by rotation; and
(j) a discharge pipe through which said pure water recovered in said second recovery tank is discharged and discarded to the exterior, and wherein an outer guard forming at least the lowermost second processing liquid guide part in said plurality of second processing liquid guide parts includes:
a first cylindrical part arranged coaxially with said substrate holding part;
an inclined part extending obliquely downwardly toward said substrate holding part from the lower end of said first cylindrical part; and
a second cylindrical part extending vertically downwardly from the lower end of said inclined part; and
an internal diameter of said first cylindrical part forming the lowermost second processing liquid guide part in said plurality of second processing liquid guide parts is greater than an internal diameter of said second cylindrical part forming a processing liquid passage corresponding to said lowermost second processing liquid guide part, and
said storage tanks contained in each of said plurality of storage parts are stacked one upon another substantially vertically.

2. A substrate processing apparatus comprising:
(a) a substrate holding part to hold a substrate in its substantially horizontal position;
(b) a rotary part to rotate said substrate held by said substrate holding part in a substantially horizontal plane;
(c) a processing liquid supply part to selectively supply a plurality of types of processing liquids to said substrate held by said substrate holding part;
(d) a plurality of guide parts of substantially annulus ring shape that receives a processing liquid flying spattering from a substrate in rotation on the side of said substrate held by said substrate holding part;
each guide part comprising:
(d-1) a pure water guide part to receive pure water flying spattering from a substrate in rotation; and
(d-2) a plurality of chemical solution guide parts that are stacked in multistage on said pure water guide part and receive a chemical solution flying spattering from a substrate in rotation;
(e) a plurality of processing liquid passages of substantially cylindrical shape that are provided to said plurality of guide parts in one-to-one correspondence and feed downwardly processing liquids introduced from their corresponding guide parts; and (f) a position adjusting part to adjust the physical relationship between said substrate held by said substrate holding part and said guide parts, such that a processing liquid flying spattering from a substrate in rotation is received by a guide part corresponding to the recovery type of the processing liquid, (g) a plurality of first recovery tanks of doughnut-like shape corresponding to said chemical solution guide parts so as to recover, through said processing liquid passages, a chemical solution flying spattering from said substrate by rotation;

(h) a plurality of storage parts that are located separately below said plurality of first recovery tanks so as to correspond to said plurality of first recovery tanks, respectively, each storage part including:

(h-1) a storage tank having a doughnut-like shape that is approximately the same as shape of the corresponding said first recovery tank; and (h-2) a plurality of pipes to connect in communication at a plurality of locations between the bottom of said corresponding said first recovery tank and the inside of said storage tank;

(i) a second recovery tank corresponding to said pure water guide part so as to recover, through said processing liquid passages, said pure water flying spattering from said substrate by rotation; and (j) a discharge pipe through which said pure water recovered in said second recovery tank is discharged and discarded to the exterior, and wherein an outer guard forming at least the lowermost chemical solution guide part in said plurality of chemical solution guide parts includes:

a first cylindrical part arranged coaxially with said substrate holding part;

an inclined part extending obliquely downwardly toward said substrate holding part from the tower end of said first cylindrical part; and a second cylindrical part extending vertically downwardly from the lower end of said inclined part; and said lowermost chemical solution guide part is disposed such that said inclined part forming the lowermost chemical solution guide part is positioned above an outer cylindrical part forming a processing liquid passage that corresponds to the chemical solution guide part immediately overlying the lowermost chemical solution guide part, and said storage tanks contained in each of said plurality of storage parts are stacked one upon another substantially vertically.

3. A substrate processing apparatus to perform a predetermined substrate processing by supplying a processing liquid to a substrate while rotating the substrate, comprising:

(a) a substrate holding part to hold a substrate in its substantially horizontal position;

(b) a rotary part to rotate said substrate held by said substrate holding part in a substantially horizontal plane;

(c) a processing liquid supply part to selectively supply a plurality of types of processing liquids to a substrate held by said substrate holding part;

(d) a four-stage splash guard that is disposed so as to annularly circumscribe a substrate held by said substrate holding part and is composed of a first guard, second guard, third guard and fourth guard arranged in inner-to-outer order; and wherein in a vertical direction, an inside of said first guard, a space between said first and second guards, a space between said second and third guards, and a space between said third and fourth guards serve as a first guide part, second guide part, third guide part and fourth guide part, respectively, in a horizontal direction, the inside of said first guard, the space between said first and second guards, the space between said second and third guards, and the space between said third and fourth guards serve as a first processing liquid passage, second processing liquid passage, third processing liquid passage and fourth processing liquid passage, respectively;

(e) a lifting part to lift and lower said splash guard substantially vertically, (f) a plurality of first recovery tanks of doughnut-like shape that correspond to said second, third and fourth processing liquid passages and recover a second processing liquid flying spattering from said substrate by rotation, (g) a plurality of storage parts that are located separately below said plurality of first recovery tanks so as to correspond to said plurality of first recovery tanks, respectively, each storage part including:

(g-1) a storage tank having a doughnut-like shape that is approximately the same as shape of the corresponding said first recovery tank; and (g-2) a plurality of pipes to connect in communication at a plurality of locations between the bottom of said corresponding said first recovery tank and the inside of said storage tank;

(h) a second recovery tank that corresponds to said first guard and recovers said first processing liquid flying spattering from said substrate by rotation; and (i) a discharge pipe through which said first processing liquid recovered in said second recovery tank is discharged and discarded to the exterior, and wherein said second guard includes:

a first cylindrical part arranged coaxially with said substrate holding part;

a projected part projecting obliquely upwardly toward said substrate holding part from the upper end of said first cylindrical part;

an inclined part extending obliquely downwardly toward said substrate holding part from the lower end of said first cylindrical part; and a second cylindrical part extending vertically downwardly from the lower end of said inclined part, said second guard is curved such that the internal diameter of said first cylindrical part forming said second guide part is greater than the internal diameter of said second cylindrical part forming said second processing liquid passage, said first guard receives a first processing liquid flying spattering from a substrate in rotation, said second, third and fourth guards receive a second processing liquid flying spattering from a substrate in rotation, said first processing liquid is pure water and said second processing liquid is a chemical solution, and said storage tanks contained in each of said plurality of storage parts are stacked one upon another substantially vertically.

4. A substrate processing apparatus to perform a predetermined substrate processing by supplying a processing liquid to a substrate while rotating said substrate, comprising:

(a) a substrate holding part to hold a substrate in its substantially horizontal position;

(b) a rotary part to rotate a substrate held by said substrate holding part in a substantially horizontal plane;

(c) a processing liquid supply part to selectively supply a plurality of types of processing liquids to a substrate held by said substrate holding part;

(d) a four-stage splash guard that is disposed so as to annularly circumscribe a substrate held by said substrate holding part and is composed of a first guard, second guard, third guard and fourth guard arranged in inner-to-outer order; and wherein in a vertical direction, an inside of said first guard, a space between said first and second guards, a space between said second and third guards, and a space between said third and fourth guards serve as a first guide part, second guide part, third guide part and fourth guide part, respectively, in a horizontal direction, the inside of said first guard, the space between said first and second guards, the space between said second and third guards, and the space between said third and fourth guards serve as a first processing liquid passage, second processing liquid passage, third processing liquid passage and fourth processing liquid passage, respectively;

(e) a lifting part to lift and lower said splash guard substantially vertically, and wherein (f) a plurality of first recovery tanks that correspond to said second, third and fourth processing liquid passages and recover a second processing liquid flying spattering from said substrate by rotation, (g) a plurality of storage parts that are located separately below said plurality of first recovery tanks so as to correspond to said plurality of first recovery tanks, respectively, each storage part including:

(g-1) a storage tank having a doughnut-like shape that is approximately the same as shape of the corresponding said first recovery tank; and (g-2) a plurality of pipes to connect in communication at a plurality of locations between the bottom of said corresponding said first recovery tank and the inside of said storage tank;

(h) a second recovery tank that corresponds to said first guard and recovers said first processing liquid flying spattering from said substrate by rotation; and (i) a discharge pipe through which said first processing liquid recovered in said second recovery tank is discharged and discarded to the exterior, and wherein said second guard includes:

a first cylindrical part arranged coaxially with said substrate holding part;

a first projected part projecting obliquely upwardly toward said substrate holding part from the upper end of said first cylindrical part;

an inclined part extending obliquely downwardly toward said substrate holding part from the lower end of said first cylindrical part; and a second cylindrical part extending vertically downwardly from the lower end of said inclined part; and said third guard includes:

a third cylindrical part arranged coaxially with said substrate holding part;

a second projected part projecting obliquely upwardly toward said substrate holding part from the upper end of said third cylindrical part; and a fourth cylindrical part that is provided fixedly so as to branch from the internal wall surface of said third cylindrical part and is disposed closer to said substrate holding part than said third cylindrical part, said second guard is curved such that said inclined part forming said second guide part is positioned above said fourth cylindrical part forming said third processing liquid passage, said first guard receives a first processing liquid flying spattering from a substrate in rotation, said second, third and fourth guards receive a second processing liquid flying spattering from a substrate in rotation, said first processing liquid is pure water and said second processing liquid is a chemical solution, and said storage tanks contained in each of said plurality of storage parts are stacked one upon another substantially vertically.

* * * * *

UNITED STATES PATENT AND TRADEMARK OFFICE
CERTIFICATE OF CORRECTION

PATENT NO. : 7,584,760 B2  Page 1 of 1
APPLICATION NO. : 10/659213
DATED : September 8, 2009
INVENTOR(S) : Miya et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 684 days.

Signed and Sealed this

Fourteenth Day of September, 2010

David J. Kappos
*Director of the United States Patent and Trademark Office*